United States Patent
Hussell

(10) Patent No.: US 12,526,889 B2
(45) Date of Patent: Jan. 13, 2026

(54) LIGHT-EMITTING DIODE PACKAGES WITH VARYING CURRENT PULSE WIDTH MODULATION AND RELATED METHODS

(71) Applicant: CreeLED, Inc., Durham, NC (US)

(72) Inventor: Christopher P. Hussell, Raleigh, NC (US)

(73) Assignee: CreeLED, Inc., Durham, NC (US)

( * ) Notice: Subject to any disclaimer, the term of this patent is extended or adjusted under 35 U.S.C. 154(b) by 148 days.

(21) Appl. No.: 18/457,442

(22) Filed: Aug. 29, 2023

(65) Prior Publication Data

US 2025/0081307 A1 Mar. 6, 2025

(51) Int. Cl.
- *H01L 25/07* (2006.01)
- *H01L 25/075* (2006.01)
- *H05B 45/325* (2020.01)

(52) U.S. Cl.
CPC ....... *H05B 45/325* (2020.01); *H01L 25/0753* (2013.01)

(58) Field of Classification Search
CPC .......... H05B 45/325; H05B 45/10; H01L 25/0753; G09G 2300/026; G09G 2310/0256; G09G 2310/0272; G09G 2320/0295; G09G 2320/041; G09G 2330/04; G09G 3/2081; G09G 3/32; G09G 3/2014

See application file for complete search history.

(56) References Cited

U.S. PATENT DOCUMENTS

| | | | |
|---|---|---|---|
| 5,359,345 A | 10/1994 | Hunter | |
| 6,016,038 A | 1/2000 | Mueller et al. | |
| 6,150,774 A | 11/2000 | Mueller et al. | |
| 6,166,496 A | 12/2000 | Lys et al. | |
| 6,211,626 B1 | 4/2001 | Lys et al. | |
| 6,292,901 B1 | 9/2001 | Lys et al. | |
| 6,538,626 B1 | 3/2003 | Nieberger et al. | |

(Continued)

FOREIGN PATENT DOCUMENTS

| | | |
|---|---|---|
| CN | 1965340 A | 5/2007 |
| CN | 101926222 A | 12/2010 |

(Continued)

OTHER PUBLICATIONS

International Search Report and Written Opinion for International Patent Application No. PCT/US2024/021668, mailed Aug. 26, 2024, 20 pages.

(Continued)

*Primary Examiner* — Towfiq Elahi
(74) *Attorney, Agent, or Firm* — Withrow & Terranova, P.L.L.C.

(57) ABSTRACT

Light-emitting diode (LED) packages and, more particularly, LED packages with varying current pulse width modulation (PWM) signals and related methods are disclosed. Varying current PWM is provided by having multiple current sources at different current levels for each LED chip in an LED package. An output PWM signal for each LED chip is routed to selectively turn on and off different combinations of current sources to provide varying current levels associated with varying brightness levels for each LED chip. By providing multiple current sources for each LED chip, the dynamic range of current levels and corresponding brightness levels may be increased for a same PWM clock frequency.

22 Claims, 11 Drawing Sheets

(56) References Cited

U.S. PATENT DOCUMENTS

| | | |
|---|---|---|
| 7,206,001 B1 | 4/2007 | Crandall et al. |
| 7,579,629 B2 | 8/2009 | Inoguchi |
| 8,111,001 B2 | 2/2012 | Underwood et al. |
| 8,328,405 B2 | 12/2012 | Negley |
| 8,922,458 B2 | 12/2014 | Sefton et al. |
| 8,937,492 B1 | 1/2015 | Gideon |
| 8,970,131 B2 | 3/2015 | Brandes et al. |
| 9,414,454 B2 | 8/2016 | Brandes et al. |
| 9,717,123 B1 | 7/2017 | Yao |
| 10,368,411 B2 | 7/2019 | Zhang et al. |
| 10,384,239 B2 | 8/2019 | Fedigan et al. |
| 10,453,827 B1 | 10/2019 | Hussell et al. |
| 10,663,418 B2 | 5/2020 | Magee et al. |
| 10,682,675 B2 | 6/2020 | Magee et al. |
| 10,695,805 B2 | 6/2020 | Magee et al. |
| 10,908,414 B2 | 2/2021 | Revier et al. |
| 12,014,677 B1 | 6/2024 | Hussell |
| 2001/0028356 A1 | 10/2001 | Balogh |
| 2002/0130627 A1 | 9/2002 | Morgan et al. |
| 2003/0058885 A1 | 3/2003 | Sorenson et al. |
| 2004/0160199 A1 | 8/2004 | Morgan et al. |
| 2004/0246278 A1 | 12/2004 | Elliott |
| 2005/0275711 A1* | 12/2005 | Liu .................. H05B 45/46 347/237 |
| 2006/0022214 A1 | 2/2006 | Morgan et al. |
| 2006/0114269 A1 | 6/2006 | Chang-Ho et al. |
| 2006/0168496 A1 | 7/2006 | Steele et al. |
| 2007/0097055 A1 | 5/2007 | Takamura et al. |
| 2007/0195025 A1 | 8/2007 | Korcharz et al. |
| 2007/0231846 A1 | 10/2007 | Cosentino et al. |
| 2007/0237165 A1 | 10/2007 | Chiang |
| 2007/0296464 A1 | 12/2007 | Lewko |
| 2008/0018261 A1 | 1/2008 | Kastner |
| 2008/0062158 A1 | 3/2008 | Willis |
| 2008/0136844 A1 | 6/2008 | Takada et al. |
| 2008/0238950 A1 | 10/2008 | Saglam |
| 2008/0245949 A1 | 10/2008 | Morimoto et al. |
| 2009/0066526 A1 | 3/2009 | Marshall et al. |
| 2009/0079362 A1 | 3/2009 | Shteynberg et al. |
| 2009/0109168 A1 | 4/2009 | Lee et al. |
| 2009/0147028 A1 | 6/2009 | Sefton et al. |
| 2009/0164713 A1 | 6/2009 | Tsai et al. |
| 2009/0179843 A1 | 7/2009 | Ackerman et al. |
| 2009/0187925 A1 | 7/2009 | Hu et al. |
| 2009/0201274 A1 | 8/2009 | Kuwabara et al. |
| 2009/0230885 A1 | 9/2009 | Tanaka |
| 2009/0278034 A1 | 11/2009 | Ackermann et al. |
| 2010/0026208 A1 | 2/2010 | Shteynberg et al. |
| 2010/0085295 A1 | 4/2010 | Zhao et al. |
| 2010/0102734 A1 | 4/2010 | Quick et al. |
| 2010/0156952 A1 | 6/2010 | Arai |
| 2010/0214764 A1 | 8/2010 | Chaves et al. |
| 2011/0057302 A1 | 3/2011 | Spehar et al. |
| 2012/0056864 A1 | 3/2012 | Aioanei |
| 2012/0126711 A1 | 5/2012 | Suminoe et al. |
| 2012/0147567 A1 | 6/2012 | Lee et al. |
| 2012/0218754 A1 | 8/2012 | Maes |
| 2012/0286674 A1 | 11/2012 | Takanashi |
| 2012/0299480 A1 | 11/2012 | Peting et al. |
| 2012/0306942 A1 | 12/2012 | Fujiwara et al. |
| 2013/0057763 A1 | 3/2013 | Cha et al. |
| 2013/0076250 A1 | 3/2013 | Logiudice |
| 2013/0114021 A1 | 5/2013 | Illyama et al. |
| 2013/0169172 A1 | 7/2013 | Kesterson et al. |
| 2013/0228672 A1 | 9/2013 | Jung et al. |
| 2014/0028776 A1 | 1/2014 | Kawamura |
| 2014/0128941 A1 | 5/2014 | Williams |
| 2014/0152902 A1 | 6/2014 | Morrisseau |
| 2014/0265919 A1 | 9/2014 | Pope et al. |
| 2014/0306966 A1 | 10/2014 | Kuo et al. |
| 2015/0276144 A1 | 10/2015 | Tudhope et al. |
| 2015/0319814 A1 | 11/2015 | Grotsch et al. |
| 2015/0348496 A1 | 12/2015 | Santos, II et al. |
| 2015/0377695 A1 | 12/2015 | Chang et al. |
| 2016/0071467 A1 | 3/2016 | Elder et al. |
| 2016/0161326 A1 | 6/2016 | Chang et al. |
| 2016/0189605 A1 | 6/2016 | Ahn et al. |
| 2016/0217762 A1 | 7/2016 | Moon et al. |
| 2016/0293811 A1 | 10/2016 | Hussell et al. |
| 2016/0314730 A1 | 10/2016 | Sampsell |
| 2016/0358528 A1 | 12/2016 | Xie et al. |
| 2017/0092198 A1 | 3/2017 | Ryu et al. |
| 2017/0168212 A1 | 6/2017 | Chen et al. |
| 2017/0263828 A1 | 9/2017 | Mao et al. |
| 2017/0294495 A1 | 10/2017 | Shyu et al. |
| 2017/0330509 A1 | 11/2017 | Cok et al. |
| 2017/0330856 A1 | 11/2017 | Zou et al. |
| 2018/0033768 A1 | 2/2018 | Kumar et al. |
| 2018/0035018 A1 | 2/2018 | Yamada et al. |
| 2018/0076368 A1 | 3/2018 | Hussell |
| 2018/0114800 A1 | 4/2018 | Pan |
| 2018/0130441 A1 | 5/2018 | Jeon |
| 2018/0182927 A1 | 6/2018 | Vampola et al. |
| 2018/0247608 A1 | 8/2018 | Chen |
| 2018/0261149 A1 | 9/2018 | Lin |
| 2018/0348959 A1 | 12/2018 | Lin et al. |
| 2019/0132921 A1 | 5/2019 | Rumer |
| 2019/0132923 A1 | 5/2019 | Rumer |
| 2019/0149792 A1 | 5/2019 | Luo et al. |
| 2019/0302917 A1 | 10/2019 | Pan |
| 2019/0335081 A1 | 10/2019 | Baar et al. |
| 2019/0371974 A1 | 12/2019 | Hussell |
| 2020/0105179 A1 | 4/2020 | Greenebaum et al. |
| 2020/0105221 A1 | 4/2020 | Marcu et al. |
| 2020/0135093 A1 | 4/2020 | Prathaban et al. |
| 2020/0184900 A1 | 6/2020 | Shin et al. |
| 2020/0203319 A1 | 6/2020 | Lee et al. |
| 2020/0219436 A1* | 7/2020 | Singer .................. G09G 3/32 |
| 2020/0251050 A1 | 8/2020 | Yee |
| 2020/0309357 A1 | 10/2020 | Hussell et al. |
| 2020/0312220 A1 | 10/2020 | Hussell et al. |
| 2020/0312222 A1 | 10/2020 | Hussell |
| 2020/0312225 A1 | 10/2020 | Hussell |
| 2020/0312226 A1 | 10/2020 | Hussell |
| 2020/0312231 A1 | 10/2020 | Hussell |
| 2020/0335042 A1 | 10/2020 | Son et al. |
| 2021/0005761 A1 | 1/2021 | Tsai et al. |
| 2021/0399183 A1 | 12/2021 | Hussell et al. |
| 2022/0028328 A1* | 1/2022 | Kim .................. G09G 3/2014 |
| 2022/0044643 A1* | 2/2022 | Gu .................. G09G 3/32 |
| 2022/0198989 A1 | 6/2022 | Park et al. |
| 2023/0252934 A1 | 8/2023 | Hussell |
| 2024/0159840 A1 | 5/2024 | Hussell |
| 2024/0274063 A1 | 8/2024 | Hussell |

FOREIGN PATENT DOCUMENTS

| | | |
|---|---|---|
| CN | 102483897 A | 5/2012 |
| CN | 205546092 U | 8/2016 |
| CN | 207852672 U | 9/2018 |
| CN | 110782828 A | 2/2020 |
| EP | 1306827 B1 | 5/2003 |
| EP | 2400682 A1 | 12/2011 |
| EP | 2515291 B1 | 11/2016 |
| JP | 2002229502 A | 8/2002 |
| JP | 2010091825 A | 4/2010 |
| JP | 201773411 A | 4/2017 |
| KR | 1020050111433 A | 11/2005 |
| KR | 20110082137 A | 7/2011 |
| TW | 201130379 A | 9/2011 |
| TW | 201313056 A | 3/2013 |
| WO | 2005048231 A1 | 5/2005 |
| WO | 2020030993 A1 | 2/2020 |
| WO | 2021183299 A1 | 9/2021 |

OTHER PUBLICATIONS

Notice of Allowance for U.S. Appl. No. 16/437,878, mailed Jul. 29, 2024, 11 pages.

Final Office Action for U.S. Appl. No. 18/320,498, mailed Sep. 6, 2024, 21 pages.

(56) References Cited

OTHER PUBLICATIONS

International Search Report and Written Opinion for International Patent Application No. PCT/US2024/043841, mailed Jan. 3, 2025, 15 pages.
Author Unknown, "APA102-2020 Super LED," Datasheet, Shenzhen LED Color Opto Electronic Co., Ltd., retrieved Apr. 10, 2019 from http://www.led-color.com/upload/201604/APA102-2020%20SMD%20LED.pdf, 6 pages.
Author Unknown, "APA102C: RGB Full Color LED control IC," iPixel LED, Shiji Lighting, retrieved Apr. 10, 2019 from https://cdn-shop.adafruit.com/datasheets/APA102.pdf, 5 pages.
Author Unknown, "Self-clocking signal," Jul. 1, 2018, Wikipedia, https://en.wikipedia.org/w/index.php?title=Self-clocking_signal&oldid=848405107, 3 pages.
Author Unknown, "Serial communication," May 2, 2019, Wikipedia, https://en.wikipedia.org/w/index.php?title=Serial_communication&oldid=895110130, 4 pages.
Author Unknown, "SK6812 Technical Data Sheet," Shenzhen LED Color Optoelectronic Co., Ltd., retrieved Apr. 10, 2019 from https://cdn-shop.adafruit.com/product-files/1138/SK6812+LED+datasheet+.pdf, 8 pages.
Author Unknown, "SK6812RGBW Specification: Integrated Light Source Intelligent Control of Chip-On-Top SMD Type LED," Jul. 31, 2015, Dongguang Opsco Optpelectronics Co., Ltd., 16 pages.
Author Unknown, "WS2811: Signal line 256 Gray level 3 channal Constant current LED drive IC," Worldsemi, retrieved May 23, 2019 from https://cdn-shop.adafruit.com/datasheets/WS2811.pdf, 7 pages.
Author Unknown, "WS2812: Intelligent control LED integrated light source," Worldsemi, retrieved Apr. 10, 2019 from https://cdn-shop.adafruit.com/datasheets/WS2811.pdf, 5 pages.
Zhu, K., "EC20-6812 Specification: Embedded Control LED," Dec. 19, 2018, Shenzhen Normand Electronic Co., Ltd., 35 pages.
Invitation to Pay Additional Fees and Partial Search for International Patent Application No. PCT/US2020/023140, mailed Jun. 16, 2020, 25 pages.
International Search Report and Written Opinion for International Patent Application No. PCT/US2020/023140, mailed Aug. 11, 2020, 27 pages.
Non-Final Office Action for U.S. Appl. No. 16/369,003, mailed Aug. 21, 2020, 15 pages.
Non-Final Office Action for U.S. Appl. No. 16/381,116, mailed Aug. 21, 2020, 8 pages.
Non-Final Office Action for U.S. Appl. No. 16/437,878, mailed Aug. 21, 2020, 14 pages.
Non-Final Office Action for U.S. Appl. No. 16/542,923, mailed Aug. 21, 2020, 15 pages.
Reason for Rejection for Japanese Patent Application No. 2021-560354, mailed Oct. 11, 2022, 7 pages.
Invitation to Pay Additional Fees and Partial Search for International Patent Application No. PCT/US2021/019708, mailed May 25, 2021, 17 pages.
International Search Report and Written Opinion for International Patent Application No. PCT/US2021/019708, mailed Jul. 19, 2021, 23 pages.
Final Office Action for U.S. Appl. No. 16/369,003, mailed Dec. 9, 2020, 17 pages.
Advisory Action for U.S. Appl. No. 16/369,003, mailed Feb. 11, 2021, 3 pages.
Non-Final Office Action for U.S. Appl. No. 16/369,003, mailed Apr. 1, 2021, 18 pages.
Final Office Action for U.S. Appl. No. 16/369,003, mailed Jul. 22, 2021, 16 pages.
Advisory Action for U.S. Appl. No. 16/369,003, mailed Sep. 23, 2021, 3 pages.
Non-Final Office Action for U.S. Appl. No. 16/369,003, mailed Nov. 12, 2021, 19 pages.
Final Office Action for U.S. Appl. No. 16/369,003, mailed Mar. 31, 2022, 23 pages.
Non-Final Office Action for U.S. Appl. No. 16/369,003, mailed Jul. 21, 2022, 29 pages.
Final Office Action for U.S. Appl. No. 16/369,003, mailed Nov. 1, 2022, 23 pages.
Final Office Action for U.S. Appl. No. 16/369,003, mailed Nov. 3, 2022, 24 pages.
Final Office Action for U.S. Appl. No. 16/369,003, mailed Dec. 12, 2022, 24 pages.
Final Office Action for U.S. Appl. No. 16/381,116, mailed Dec. 10, 2020, 10 pages.
Advisory Action for U.S. Appl. No. 16/381,116, mailed Feb. 11, 2021, 3 pages.
Non-Final Office Action for U.S. Appl. No. 16/381,116, mailed Apr. 1, 2021, 12 pages.
Final Office Action for U.S. Appl. No. 16/381,116, mailed Jul. 22, 2021, 9 pages.
Non-Final Office Action for U.S. Appl. No. 16/381,116, mailed Nov. 12, 2021, 10 pages.
Final Office Action for U.S. Appl. No. 16/381,116, mailed Mar. 2, 2022, 17 pages.
Advisory Action and Examiner-Initiated Interview Summary for U.S. Appl. No. 16/381,116, mailed May 6, 2022, 4 pages.
Non-Final Office Action for U.S. Appl. No. 16/381,116, mailed Jun. 22, 2022, 17 pages.
Final Office Action for U.S. Appl. No. 16/381,116, mailed Oct. 4, 2022, 17 pages.
Final Office Action for U.S. Appl. No. 16/437,878, mailed Dec. 9, 2020, 14 pages.
Advisory Action and Examiner-Initiated Interview Summary for U.S. Appl. No. 16/437,878, mailed Feb. 11, 2021, 4 pages.
Non-Final Office Action for U.S. Appl. No. 16/437,878, mailed Apr. 1, 2021, 16 pages.
Non-Final Office Action for U.S. Appl. No. 16/437,878, mailed Apr. 23, 2021, 17 pages.
Final Office Action for U.S. Appl. No. 16/437,878, mailed Sep. 1, 2021, 16 pages.
Non-Final Office Action for U.S. Appl. No. 16/437,878, mailed Dec. 15, 2021, 17 pages.
Final Office Action for U.S. Appl. No. 16/437,878, mailed Mar. 31, 2022, 22 pages.
Final Office Action for U.S. Appl. No. 16/437,878, mailed Jul. 21, 2022, 23 pages.
Non-Final Office Action for U.S. Appl. No. 16/437,878, mailed Oct. 27, 2022, 21 pages.
Final Office Action for U.S. Appl. No. 16/542,923, mailed Dec. 10, 2020, 16 pages.
Advisory Action and Examiner-Initiated Interview Summary for U.S. Appl. No. 16/542,923, mailed Feb. 11, 2021, 4 pages.
Non-Final Office Action for U.S. Appl. No. 16/542,923, mailed Apr. 1, 2021, 19 pages.
Decision to Grant for Japanese Patent Application No. 2023-113594, mailed Nov. 7, 2024, 5 pages.
Decision on Appeal for U.S. Appl. No. 16/381,116, mailed Sep. 23, 2024, 14 pages.
Advisory Action for U.S. Appl. No. 18/320,498, mailed Nov. 6, 2024, 4 pages.
Non-Final Office Action for U.S. Appl. No. 18/655,639, mailed Nov. 22, 2024, 10 pages.
Notice of Reason for Rejection for Japanese Patent Application No. 2022-554701, mailed Sep. 19, 2023, 11 pages.
Advisory Action for U.S. Appl. No. 16/437,878, mailed Nov. 28, 2023, 3 pages.
Non-Final Office Action for U.S. Appl. No. 18/320,498, mailed Dec. 6, 2023, 12 pages.
Final Office Action for U.S. Appl. No. 16/542,923, mailed Jul. 22, 2021, 19 pages.
Advisory Action for U.S. Appl. No. 16/542,923, mailed Sep. 23, 2021, 3 pages.
Non-Final Office Action for U.S. Appl. No. 16/542,923, mailed Nov. 12, 2021, 21 pages.
Final Office Action for U.S. Appl. No. 16/542,923, mailed Mar. 2, 2022, 21 pages.

(56) References Cited

OTHER PUBLICATIONS

Advisory Action and Examiner-Initiated Interview Summary for U.S. Appl. No. 16/542,923, mailed May 6, 2022, 4 pages.
Non-Final Office Action for U.S. Appl. No. 16/542,923, mailed Jun. 22, 2022, 23 pages.
Final Office Action for U.S. Appl. No. 16/542,923, mailed Oct. 7, 2022, 23 pages.
Final Office Action for U.S. Appl. No. 16/542,923, mailed Nov. 14, 2022, 29 pages.
Advisory Action and Examiner-Initiated Interview Summary for U.S. Appl. No. 16/542,923, mailed Dec. 15, 2022, 4 pages.
Non-Final Office Action for U.S. Appl. No. 16/543,009, mailed Apr. 1, 2021, 14 pages.
Final Office Action for U.S. Appl. No. 16/543,009, mailed Jul. 23, 2021, 15 pages.
Advisory Action for U.S. Appl. No. 16/543,009, mailed Sep. 23, 2021, 3 pages.
Final Office Action for U.S. Appl. No. 16/543,009, mailed Nov. 12, 2021, 15 pages.
Non-Final Office Action for U.S. Appl. No. 16/543,009, mailed Mar. 4, 2022, 15 pages.
Final Office Action for U.S. Appl. No. 16/543,009, mailed Jun. 10, 2022, 16 pages.
Non-Final Office Action for U.S. Appl. No. 16/543,009, mailed Oct. 7, 2022, 16 pages.
Final Office Action for U.S. Appl. No. 16/543,009, mailed Jan. 19, 2023, 19 pages.
Non-Final Office Action for U.S. Appl. No. 16/815,101, mailed Nov. 12, 2021, 13 pages.
Final Office Action for U.S. Appl. No. 16/815,101, mailed Mar. 2, 2022, 14 pages.
Advisory Action and Examiner-Initiated Interview Summary for U.S. Appl. No. 16/815,101, mailed May 6, 2022, 4 pages.
Non-Final Office Action for U.S. Appl. No. 16/815,101, mailed Jun. 22, 2022, 17 pages.
Final Office Action for U.S. Appl. No. 16/815,101, mailed Oct. 7, 2022, 16 pages.
Advisory Action and Examiner-Initiated Interview Summary for U.S. Appl. No. 16/815,101, mailed Dec. 20, 2022, 4 pages.
Ex Parte Quayle Action for U.S. Appl. No. 16/815,101, mailed Jan. 19, 2023, 7 pages.
Non-Final Office Action for U.S. Appl. No. 17/081,522, mailed Jan. 20, 2022, 18 pages.
Final Office Action for U.S. Appl. No. 17/081,522, mailed Apr. 28, 2022, 10 pages.
Advisory Action for U.S. Appl. No. 17/081,522, mailed Jul. 5, 2022, 3 pages.
Non-Final Office Action for U.S. Appl. No. 17/081,522, mailed Aug. 17, 2022, 9 pages.
Final Office Action for U.S. Appl. No. 17/081,522, mailed Nov. 10, 2022, 10 pages.
Advisory Action and Examiner-Initiated Interview Summary for U.S. Appl. No. 17/081,522, mailed Jan. 23, 2023, 4 pages.
Non-Final Office Action for U.S. Appl. No. 16/906,129, mailed Jun. 9, 2022, 14 pages.
Final Office Action for U.S. Appl. No. 16/906,129, mailed Dec. 12, 2022, 15 pages.
Notice of Allowance and Examiner-Initiated Interview Summary for U.S. Appl. No. 16/542,923, mailed Mar. 17, 2023, 11 pages.
Notice of Allowance for U.S. Appl. No. 16/815,101, mailed Feb. 13, 2023, 10 pages.
Non-Final Office Action for U.S. Appl. No. 17/081,522, mailed Mar. 2, 2023, 11 pages.
Notice of Allowance for U.S. Appl. No. 16/906,129, mailed Feb. 27, 2023, 10 pages.
Notice of Reason for Rejection for Japanese Patent Application No. 2021-560354, mailed Mar. 10, 2023, 4 pages.
International Search Report and Written Opinion for International Patent Application No. PCT/US2023/061653, mailed Apr. 6, 2023, 24 pages.
Notice of Allowance for U.S. Appl. No. 16/369,003, mailed Mar. 30, 2023, 9 pages.
Advisory Action and Examiner-Initiated Interview Summary for U.S. Appl. No. 16/437,878, mailed Apr. 14, 2023, 4 pages.
Non-Final Office Action for U.S. Appl. No. 16/437,878, mailed May 31, 2023, 19 pages.
Advisory Action and Examiner-Initiated Interview Summary for U.S. Appl. No. 16/543,009, mailed Mar. 28, 2023, 4 pages.
Notice of Allowance for U.S. Appl. No. 16/543,009, mailed May 24, 2023, 10 pages.
Final Office Action for U.S. Appl. No. 17/081,522, mailed Jun. 7, 2023, 11 pages.
Examination Report for European Patent Application No. 20718953.1, mailed Jul. 6, 2023, 11 pages.
Author Unknown, "ARRI LogC4: Logarithmic Color Space," Specification, May 12, 2023, ARRI AG, 20 pages.
Final Office Action for U.S. Appl. No. 16/437,878, mailed Sep. 19, 2023, 20 pages.
Non-Final Office Action for U.S. Appl. No. 17/081,522, mailed Sep. 13, 2023, 13 pages.
Non-Final Office Action for U.S. Appl. No. 18/065,397, mailed Aug. 28, 2023, 9 pages.
Non-Final Office Action for U.S. Appl. No. 18/298,049, mailed Oct. 5, 2023, 9 pages.
Notification to Grant for Chinese Patent Application No. 202080025541.3, mailed Mar. 20, 2024, 6 pages.
Notice of Preliminary Rejection for Korean Patent Application No. 10-2022-7034893, mailed Mar. 7, 2024, 17 pages.
Invitation to Pay Additional Fees and Partial Search for International Patent Application No. PCT/US2024/013657, mailed Apr. 15, 2024, 11 pages.
Written Decision on Registration for Korean Patent Application No. 10-2021-7035365, mailed Mar. 18, 2024, 7 pages.
Advisory Action and Examiner-Initiated Interview Summary for U.S. Appl. No. 18/320,498, mailed May 3, 2024, 4 pages.
Examination Report for European Patent Application No. 21713274.5, mailed May 28, 2024, 7 pages.
Notice of Reason for Rejection for Japanese Patent Application No. 2023-113594, mailed May 28, 2024, 10 pages.
Notification to Grant for Korean Patent Application No. 10-2022-7034893, mailed Jun. 18, 2024, 5 pages.
International Search Report and Written Opinion for International Patent Application No. PCT/US2024/013657, mailed Jun. 12, 2024, 17 pages.
Invitation to Pay Additional Fees and Partial Search for International Patent Application No. PCT/US2024/021668, mailed Jul. 5, 2024, 13 pages.
Advisory Action and Examiner-Initiated Interview Summary for U.S. Appl. No. 16/437,878, mailed Jun. 4, 2024, 4 pages.
Non-Final Office Action for U.S. Appl. No. 18/320,498, mailed May 28, 2024, 18 pages.
Notice of Preliminary Rejection for Korean Patent Application No. 10-2024-7018777, mailed Jun. 25, 2024, 19 pages.
Decision to Grant for Japanese Patent Application No. 2022-554701, mailed Feb. 20, 2024, 6 pages.
International Search Report and Written Opinion for International Patent Application No. PCT/US2023/079460, mailed Feb. 23, 2024, 16 pages.
Final Office Action for U.S. Appl. No. 16/437,878, mailed Apr. 5, 2024, 21 pages.
Final Office Action for U.S. Appl. No. 18/320,498, mailed Feb. 27, 2024, 14 pages.
Notice of Allowance for U.S. Appl. No. 17/081,522, mailed Apr. 5, 2024, 8 pages.
Notice of Allowance for U.S. Appl. No. 18/298,049, mailed Feb. 2, 2024, 9 pages.
Advisory Action and Examiner-Initiated Interview Summary for U.S. Appl. No. 17/081,522, mailed Feb. 16, 2024, 5 pages.
Non-Final Office Action for U.S. Appl. No. 16/437,878, mailed Jan. 3, 2024, 20 pages.
Final Office Action for U.S. Appl. No. 17/081,522, mailed Dec. 13, 2023, 15 pages.

(56) References Cited

OTHER PUBLICATIONS

First Office Action for Chinese Patent Application No. 2020800255413, mailed Oct. 25, 2023, 19 pages.
Examination Report for Taiwanese Patent Application No. 113131431, mailed Apr. 28, 2025, 16 pages.

\* cited by examiner

| Brightness Value | | Standard | Segment | Current | Time (Showing one PWM Period) | | | | | | | | | | | | | | | |
|---|---|---|---|---|---|---|---|---|---|---|---|---|---|---|---|---|---|---|---|---|---|
| 0 | 000000 | 00 | 00 | 00 | 0 | 0 | 0 | 0 | 0 | 0 | 0 | 0 | 0 | 0 | 0 | 0 | 0 | 0 | 0 | 0 | 0 |
| 1 | 000001 | 00 | 00 | 01 | 1 | 0 | 0 | 0 | 0 | 0 | 0 | 0 | 0 | 0 | 0 | 0 | 0 | 0 | 0 | 0 | 0 |
| 2 | 000010 | 00 | 00 | 10 | 2 | 0 | 0 | 0 | 0 | 0 | 0 | 0 | 0 | 0 | 0 | 0 | 0 | 0 | 0 | 0 | 0 |
| 3 | 000011 | 00 | 00 | 11 | 3 | 0 | 0 | 0 | 0 | 0 | 0 | 0 | 0 | 0 | 0 | 0 | 0 | 0 | 0 | 0 | 0 |
| 4 | 000100 | 00 | 01 | 00 | 4 | 0 | 0 | 0 | 0 | 0 | 0 | 0 | 0 | 0 | 0 | 0 | 0 | 0 | 0 | 0 | 0 |
| 5 | 000101 | 00 | 01 | 01 | 4 | 0 | 0 | 0 | 1 | 0 | 0 | 0 | 0 | 0 | 0 | 0 | 0 | 0 | 0 | 0 | 0 |
| 6 | 000110 | 00 | 01 | 10 | 4 | 0 | 0 | 0 | 2 | 0 | 0 | 0 | 0 | 0 | 0 | 0 | 0 | 0 | 0 | 0 | 0 |
| 7 | 000111 | 00 | 01 | 11 | 4 | 0 | 0 | 0 | 3 | 0 | 0 | 0 | 0 | 0 | 0 | 0 | 0 | 0 | 0 | 0 | 0 |
| 8 | 001000 | 00 | 10 | 00 | 4 | 0 | 0 | 0 | 4 | 0 | 0 | 0 | 0 | 0 | 0 | 0 | 0 | 0 | 0 | 0 | 0 |
| 9 | 001001 | 00 | 10 | 01 | 4 | 0 | 0 | 0 | 4 | 0 | 0 | 0 | 1 | 0 | 0 | 0 | 0 | 0 | 0 | 0 | 0 |
| 10 | 001010 | 00 | 10 | 10 | 4 | 0 | 0 | 0 | 4 | 0 | 0 | 0 | 2 | 0 | 0 | 0 | 0 | 0 | 0 | 0 | 0 |
| 11 | 001011 | 00 | 10 | 11 | 4 | 0 | 0 | 0 | 4 | 0 | 0 | 0 | 3 | 0 | 0 | 0 | 0 | 0 | 0 | 0 | 0 |
| 12 | 001100 | 00 | 11 | 00 | 4 | 0 | 0 | 0 | 4 | 0 | 0 | 0 | 4 | 0 | 0 | 0 | 0 | 0 | 0 | 0 | 0 |
| 13 | 001101 | 00 | 11 | 01 | 4 | 0 | 0 | 0 | 4 | 0 | 0 | 0 | 4 | 0 | 0 | 0 | 1 | 0 | 0 | 0 | 0 |
| 14 | 001110 | 00 | 11 | 10 | 4 | 0 | 0 | 0 | 4 | 0 | 0 | 0 | 4 | 0 | 0 | 0 | 2 | 0 | 0 | 0 | 0 |
| 15 | 001111 | 00 | 11 | 11 | 4 | 0 | 0 | 0 | 4 | 0 | 0 | 0 | 4 | 0 | 0 | 0 | 3 | 0 | 0 | 0 | 0 |
| 16 | 010000 | 01 | 00 | 00 | 4 | 0 | 0 | 0 | 4 | 0 | 0 | 0 | 4 | 0 | 0 | 0 | 4 | 0 | 0 | 0 | 0 |
| 17 | 010001 | 01 | 00 | 01 | 4 | 1 | 0 | 0 | 4 | 0 | 0 | 0 | 4 | 0 | 0 | 0 | 4 | 0 | 0 | 0 | 0 |
| 18 | 010010 | 01 | 00 | 10 | 4 | 2 | 0 | 0 | 4 | 0 | 0 | 0 | 4 | 0 | 0 | 0 | 4 | 0 | 0 | 0 | 0 |
| 19 | 010011 | 01 | 00 | 11 | 4 | 3 | 0 | 0 | 4 | 0 | 0 | 0 | 4 | 0 | 0 | 0 | 4 | 0 | 0 | 0 | 0 |
| 20 | 010100 | 01 | 01 | 00 | 4 | 4 | 0 | 0 | 4 | 0 | 0 | 0 | 4 | 0 | 0 | 0 | 4 | 0 | 0 | 0 | 0 |
| 21 | 010101 | 01 | 01 | 01 | 4 | 4 | 0 | 0 | 4 | 1 | 0 | 0 | 4 | 0 | 0 | 0 | 4 | 0 | 0 | 0 | 0 |
| 22 | 010110 | 01 | 01 | 10 | 4 | 4 | 0 | 0 | 4 | 2 | 0 | 0 | 4 | 0 | 0 | 0 | 4 | 0 | 0 | 0 | 0 |
| 23 | 010111 | 01 | 01 | 11 | 4 | 4 | 0 | 0 | 4 | 3 | 0 | 0 | 4 | 0 | 0 | 0 | 4 | 0 | 0 | 0 | 0 |
| 24 | 011000 | 01 | 10 | 00 | 4 | 4 | 0 | 0 | 4 | 4 | 0 | 0 | 4 | 0 | 0 | 0 | 4 | 0 | 0 | 0 | 0 |
| 25 | 011001 | 01 | 10 | 01 | 4 | 4 | 0 | 0 | 4 | 4 | 0 | 0 | 4 | 1 | 0 | 0 | 4 | 0 | 0 | 0 | 0 |
| 26 | 011010 | 01 | 10 | 10 | 4 | 4 | 0 | 0 | 4 | 4 | 0 | 0 | 4 | 2 | 0 | 0 | 4 | 0 | 0 | 0 | 0 |
| 27 | 011011 | 01 | 10 | 11 | 4 | 4 | 0 | 0 | 4 | 4 | 0 | 0 | 4 | 3 | 0 | 0 | 4 | 0 | 0 | 0 | 0 |
| 28 | 011100 | 01 | 11 | 00 | 4 | 4 | 0 | 0 | 4 | 4 | 0 | 0 | 4 | 4 | 0 | 0 | 4 | 0 | 0 | 0 | 0 |
| 29 | 011101 | 01 | 11 | 01 | 4 | 4 | 0 | 0 | 4 | 4 | 0 | 0 | 4 | 4 | 0 | 0 | 4 | 1 | 0 | 0 | 0 |
| 30 | 011110 | 01 | 11 | 10 | 4 | 4 | 0 | 0 | 4 | 4 | 0 | 0 | 4 | 4 | 0 | 0 | 4 | 2 | 0 | 0 | 0 |
| 31 | 011111 | 01 | 11 | 11 | 4 | 4 | 0 | 0 | 4 | 4 | 0 | 0 | 4 | 4 | 0 | 0 | 4 | 3 | 0 | 0 | 0 |
| 32 | 100000 | 10 | 00 | 00 | 4 | 4 | 0 | 0 | 4 | 4 | 0 | 0 | 4 | 4 | 0 | 0 | 4 | 4 | 0 | 0 | 0 |
| 33 | 100001 | 10 | 00 | 01 | 4 | 4 | 1 | 0 | 4 | 4 | 0 | 0 | 4 | 4 | 0 | 0 | 4 | 4 | 0 | 0 | 0 |
| 34 | 100010 | 10 | 00 | 10 | 4 | 4 | 2 | 0 | 4 | 4 | 0 | 0 | 4 | 4 | 0 | 0 | 4 | 4 | 0 | 0 | 0 |
| 35 | 100011 | 10 | 00 | 11 | 4 | 4 | 3 | 0 | 4 | 4 | 0 | 0 | 4 | 4 | 0 | 0 | 4 | 4 | 0 | 0 | 0 |
| 36 | 100100 | 10 | 01 | 00 | 4 | 4 | 4 | 0 | 4 | 4 | 0 | 0 | 4 | 4 | 0 | 0 | 4 | 4 | 0 | 0 | 0 |

| Brightness Value | | Standard | Segment | Current | Time (Showing one PWM Period) | | | | | | | | | | | | | | | |
|---|---|---|---|---|---|---|---|---|---|---|---|---|---|---|---|---|---|---|---|---|---|
| 0 | 000000 | 00 | 00 | 00 | 0 | 0 | 0 | 0 | 0 | 0 | 0 | 0 | 0 | 0 | 0 | 0 | 0 | 0 | 0 | 0 | 0 |
| 1 | 000001 | 00 | 00 | 01 | 0 | 0 | 0 | 0 | 0 | 0 | 0 | 0 | 0 | 0 | 0 | 0 | 0 | 1 | 0 | 0 | 0 |
| 2 | 000010 | 00 | 00 | 10 | 0 | 0 | 0 | 0 | 0 | 0 | 0 | 0 | 0 | 0 | 0 | 0 | 0 | 2 | 0 | 0 | 0 |
| 3 | 000011 | 00 | 00 | 11 | 0 | 0 | 0 | 0 | 0 | 0 | 0 | 0 | 0 | 0 | 0 | 0 | 0 | 3 | 0 | 0 | 0 |
| 4 | 000100 | 00 | 01 | 00 | 0 | 0 | 0 | 0 | 0 | 0 | 0 | 0 | 0 | 0 | 0 | 0 | 0 | 4 | 0 | 0 | 0 |
| 5 | 000101 | 00 | 01 | 01 | 0 | 0 | 0 | 0 | 0 | 0 | 0 | 0 | 0 | 0 | 0 | 0 | 4 | 1 | 0 | 0 | 0 |
| 6 | 000110 | 00 | 01 | 10 | 0 | 0 | 0 | 0 | 0 | 0 | 0 | 0 | 0 | 0 | 0 | 0 | 4 | 2 | 0 | 0 | 0 |
| 7 | 000111 | 00 | 01 | 11 | 0 | 0 | 0 | 0 | 0 | 0 | 0 | 0 | 0 | 0 | 0 | 0 | 4 | 3 | 0 | 0 | 0 |
| 8 | 001000 | 00 | 10 | 00 | 0 | 0 | 0 | 0 | 0 | 0 | 0 | 0 | 0 | 0 | 0 | 0 | 4 | 4 | 0 | 0 | 0 |
| 9 | 001001 | 00 | 10 | 01 | 0 | 0 | 0 | 0 | 0 | 0 | 0 | 4 | 0 | 0 | 0 | 0 | 4 | 1 | 0 | 0 | 0 |
| 10 | 001010 | 00 | 10 | 10 | 0 | 0 | 0 | 0 | 0 | 0 | 0 | 4 | 0 | 0 | 0 | 0 | 4 | 2 | 0 | 0 | 0 |
| 11 | 001011 | 00 | 10 | 11 | 0 | 0 | 0 | 0 | 0 | 0 | 0 | 4 | 0 | 0 | 0 | 0 | 4 | 3 | 0 | 0 | 0 |
| 12 | 001100 | 00 | 11 | 00 | 0 | 0 | 0 | 0 | 0 | 0 | 0 | 4 | 0 | 0 | 0 | 0 | 4 | 4 | 0 | 0 | 0 |
| 13 | 001101 | 00 | 11 | 01 | 0 | 0 | 0 | 4 | 0 | 0 | 0 | 4 | 0 | 0 | 0 | 0 | 4 | 1 | 0 | 0 | 0 |
| 14 | 001110 | 00 | 11 | 10 | 0 | 0 | 0 | 4 | 0 | 0 | 0 | 4 | 0 | 0 | 0 | 0 | 4 | 2 | 0 | 0 | 0 |
| 15 | 001111 | 00 | 11 | 11 | 0 | 0 | 0 | 4 | 0 | 0 | 0 | 4 | 0 | 0 | 0 | 0 | 4 | 3 | 0 | 0 | 0 |
| 16 | 010000 | 01 | 00 | 00 | 0 | 0 | 0 | 4 | 0 | 0 | 0 | 4 | 0 | 0 | 0 | 0 | 4 | 4 | 0 | 0 | 0 |
| 17 | 010001 | 01 | 00 | 01 | 0 | 0 | 0 | 4 | 0 | 0 | 0 | 4 | 0 | 0 | 0 | 0 | 4 | 1 | 0 | 0 | 4 |
| 18 | 010010 | 01 | 00 | 10 | 0 | 0 | 0 | 4 | 0 | 0 | 0 | 4 | 0 | 0 | 0 | 0 | 4 | 2 | 0 | 0 | 4 |
| 19 | 010011 | 01 | 00 | 11 | 0 | 0 | 0 | 4 | 0 | 0 | 0 | 4 | 0 | 0 | 0 | 0 | 4 | 3 | 0 | 0 | 4 |
| 20 | 010100 | 01 | 01 | 00 | 0 | 0 | 0 | 4 | 0 | 0 | 0 | 4 | 0 | 0 | 0 | 0 | 4 | 4 | 0 | 0 | 4 |
| 21 | 010101 | 01 | 01 | 01 | 0 | 0 | 0 | 4 | 0 | 0 | 0 | 4 | 0 | 0 | 0 | 4 | 4 | 1 | 0 | 0 | 4 |
| 22 | 010110 | 01 | 01 | 10 | 0 | 0 | 0 | 4 | 0 | 0 | 0 | 4 | 0 | 0 | 0 | 4 | 4 | 2 | 0 | 0 | 4 |
| 23 | 010111 | 01 | 01 | 11 | 0 | 0 | 0 | 4 | 0 | 0 | 0 | 4 | 0 | 0 | 0 | 4 | 4 | 3 | 0 | 0 | 4 |
| 24 | 011000 | 01 | 10 | 00 | 0 | 0 | 0 | 4 | 0 | 0 | 0 | 4 | 0 | 0 | 0 | 4 | 4 | 4 | 0 | 0 | 4 |
| 25 | 011001 | 01 | 10 | 01 | 0 | 0 | 0 | 4 | 0 | 0 | 4 | 4 | 0 | 0 | 0 | 4 | 4 | 1 | 0 | 0 | 4 |
| 26 | 011010 | 01 | 10 | 10 | 0 | 0 | 0 | 4 | 0 | 0 | 4 | 4 | 0 | 0 | 0 | 4 | 4 | 2 | 0 | 0 | 4 |
| 27 | 011011 | 01 | 10 | 11 | 0 | 0 | 0 | 4 | 0 | 0 | 4 | 4 | 0 | 0 | 0 | 4 | 4 | 3 | 0 | 0 | 4 |
| 28 | 011100 | 01 | 11 | 00 | 0 | 0 | 0 | 4 | 0 | 0 | 4 | 4 | 0 | 0 | 0 | 4 | 4 | 4 | 0 | 0 | 4 |
| 29 | 011101 | 01 | 11 | 01 | 0 | 0 | 4 | 4 | 0 | 0 | 4 | 4 | 0 | 0 | 0 | 4 | 4 | 1 | 0 | 0 | 4 |
| 30 | 011110 | 01 | 11 | 10 | 0 | 0 | 4 | 4 | 0 | 0 | 4 | 4 | 0 | 0 | 0 | 4 | 4 | 2 | 0 | 0 | 4 |
| 31 | 011111 | 01 | 11 | 11 | 0 | 0 | 4 | 4 | 0 | 0 | 4 | 4 | 0 | 0 | 0 | 4 | 4 | 3 | 0 | 0 | 4 |
| 32 | 100000 | 10 | 00 | 00 | 0 | 0 | 4 | 4 | 0 | 0 | 4 | 4 | 0 | 0 | 0 | 4 | 4 | 4 | 0 | 0 | 4 |
| 33 | 100001 | 10 | 00 | 01 | 0 | 0 | 4 | 4 | 0 | 0 | 4 | 4 | 0 | 0 | 4 | 4 | 4 | 1 | 0 | 4 | 4 |
| 34 | 100010 | 10 | 00 | 10 | 0 | 0 | 4 | 4 | 0 | 0 | 4 | 4 | 0 | 0 | 4 | 4 | 4 | 2 | 0 | 4 | 4 |
| 35 | 100011 | 10 | 00 | 11 | 0 | 0 | 4 | 4 | 0 | 0 | 4 | 4 | 0 | 0 | 4 | 4 | 4 | 3 | 0 | 4 | 4 |
| 36 | 100100 | 10 | 01 | 00 | 0 | 0 | 4 | 4 | 0 | 0 | 4 | 4 | 0 | 0 | 4 | 4 | 4 | 4 | 0 | 4 | 4 |

FIG. 7A

| Value (Decimal and Binary) | | | | | | | | | | | | | | | | | | | | |
|---|---|---|---|---|---|---|---|---|---|---|---|---|---|---|---|---|---|---|---|---|
| 37 | 100101 | 10 | 01 | 01 | 0 | 0 | 4 | 4 | 0 | 4 | 4 | 0 | 4 | 4 | 4 | 4 | 1 | 0 | 4 | 4 |
| 38 | 100110 | 10 | 01 | 10 | 0 | 0 | 4 | 4 | 0 | 4 | 4 | 0 | 4 | 4 | 4 | 4 | 2 | 0 | 4 | 4 |
| 39 | 100111 | 10 | 01 | 11 | 0 | 0 | 4 | 4 | 0 | 4 | 4 | 0 | 4 | 4 | 4 | 4 | 3 | 0 | 4 | 4 |
| 40 | 101000 | 10 | 10 | 00 | 0 | 0 | 4 | 4 | 0 | 4 | 4 | 0 | 4 | 4 | 4 | 4 | 4 | 0 | 4 | 4 |
| 41 | 101001 | 10 | 10 | 01 | 0 | 0 | 4 | 4 | 0 | 4 | 4 | 0 | 4 | 4 | 4 | 4 | 1 | 0 | 4 | 4 |
| 42 | 101010 | 10 | 10 | 10 | 0 | 0 | 4 | 4 | 0 | 4 | 4 | 0 | 4 | 4 | 4 | 4 | 2 | 0 | 4 | 4 |
| 43 | 101011 | 10 | 10 | 11 | 0 | 0 | 4 | 4 | 0 | 4 | 4 | 0 | 4 | 4 | 4 | 4 | 3 | 0 | 4 | 4 |
| 44 | 101100 | 10 | 11 | 00 | 0 | 0 | 4 | 4 | 0 | 4 | 4 | 0 | 4 | 4 | 4 | 4 | 4 | 0 | 4 | 4 |
| 45 | 101101 | 10 | 11 | 01 | 0 | 4 | 4 | 4 | 0 | 4 | 4 | 0 | 4 | 4 | 4 | 4 | 1 | 0 | 4 | 4 |
| 46 | 101110 | 10 | 11 | 00 | 0 | 4 | 4 | 4 | 0 | 4 | 4 | 0 | 4 | 4 | 4 | 4 | 2 | 0 | 4 | 4 |
| 47 | 101111 | 10 | 11 | 11 | 0 | 4 | 4 | 4 | 0 | 4 | 4 | 0 | 4 | 4 | 4 | 4 | 3 | 0 | 4 | 4 |
| 48 | 110000 | 11 | 10 | 00 | 0 | 4 | 4 | 4 | 0 | 4 | 4 | 0 | 4 | 4 | 4 | 4 | 4 | 0 | 4 | 4 |
| 49 | 110001 | 11 | 10 | 00 | 0 | 4 | 4 | 4 | 0 | 4 | 4 | 0 | 4 | 4 | 4 | 4 | 1 | 4 | 4 | 4 |
| 50 | 110010 | 11 | 10 | 00 | 0 | 4 | 4 | 4 | 0 | 4 | 4 | 0 | 4 | 4 | 4 | 4 | 2 | 4 | 4 | 4 |
| 51 | 110011 | 11 | 00 | 11 | 0 | 4 | 4 | 4 | 0 | 4 | 4 | 0 | 4 | 4 | 4 | 4 | 3 | 4 | 4 | 4 |
| 52 | 110100 | 11 | 01 | 00 | 0 | 4 | 4 | 4 | 0 | 4 | 4 | 0 | 4 | 4 | 4 | 4 | 4 | 4 | 4 | 4 |
| 53 | 110101 | 11 | 01 | 01 | 0 | 4 | 4 | 4 | 0 | 4 | 4 | 4 | 4 | 4 | 4 | 4 | 1 | 4 | 4 | 4 |
| 54 | 110110 | 11 | 01 | 10 | 0 | 4 | 4 | 4 | 0 | 4 | 4 | 4 | 4 | 4 | 4 | 4 | 2 | 4 | 4 | 4 |
| 55 | 110111 | 11 | 01 | 10 | 0 | 4 | 4 | 4 | 0 | 4 | 4 | 4 | 4 | 4 | 4 | 4 | 3 | 4 | 4 | 4 |
| 56 | 111000 | 11 | 10 | 00 | 0 | 4 | 4 | 4 | 0 | 4 | 4 | 4 | 4 | 4 | 4 | 4 | 4 | 4 | 4 | 4 |
| 57 | 111001 | 11 | 10 | 01 | 0 | 4 | 4 | 4 | 4 | 4 | 4 | 4 | 4 | 4 | 4 | 4 | 1 | 4 | 4 | 4 |
| 58 | 111010 | 11 | 10 | 10 | 0 | 4 | 4 | 4 | 4 | 4 | 4 | 4 | 4 | 4 | 4 | 4 | 2 | 4 | 4 | 4 |
| 59 | 111011 | 11 | 10 | 11 | 0 | 4 | 4 | 4 | 4 | 4 | 4 | 4 | 4 | 4 | 4 | 4 | 3 | 4 | 4 | 4 |

FIG. 7B

LIGHT-EMITTING DIODE PACKAGES WITH VARYING CURRENT PULSE WIDTH MODULATION AND RELATED METHODS

FIELD OF THE DISCLOSURE

The present disclosure relates to light-emitting diode (LED) packages and, more particularly, to LED packages with varying current pulse width modulation signals and related methods.

BACKGROUND

Light-emitting diodes (LEDs) are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions.

LEDs have been widely adopted in various illumination contexts, for backlighting of liquid crystal display (LCD) systems (e.g., as a substitute for cold cathode fluorescent lamps) and for direct-view LED displays. Applications utilizing LED arrays include vehicular headlamps, roadway illumination, light fixtures, and various indoor, outdoor, and specialty contexts. Desirable characteristics of LED devices include high luminous efficacy and long lifetime.

Large format multi-color direct-view LED displays (including full color LED video screens) typically include numerous individual LED panels, packages, and/or components providing image resolution determined by the distance between adjacent pixels or "pixel pitch." Direct-view LED displays typically include three-color displays with arrayed red, green, and blue (RGB) LEDs, and two-color displays with arrayed red and green (RG) LEDs. Other colors and combinations of colors may be used. For many LED display systems, it is desirable to form LED color groups for each pixel such as primary colors red, green, and blue (RGB) that define vertices of a triangle (or polygon) on a chromaticity diagram. This polygon defines the so-called color gamut of the display device, the area of which describes all the possible colors that the display device is capable of producing. Driver printed circuit boards for controlling LED displays are typically densely populated with electrical devices including capacitors, field effect transistors (FETs), decoders, microcontrollers, and the like for driving the pixels of the display. As pixel pitches continue to decrease for higher resolution displays, the density of such electrical devices scales higher corresponding to the increased number of pixels for a given panel area. This tends to add higher complexity and costs to LED panels for display applications.

The art continues to seek improved LED array devices with small pixel pitches while overcoming limitations associated with conventional devices and production methods.

SUMMARY

The present disclosure relates to light-emitting diode (LED) packages and, more particularly, to LED packages with varying current pulse width modulation (PWM) signals and related methods. Varying current PWM is provided by having multiple current sources at different current levels for each LED chip in an LED package. An output PWM signal for each LED chip is routed to selectively turn on and off different combinations of current sources to provide varying current levels associated with varying brightness levels for each LED chip. By providing multiple current sources for each LED chip, the dynamic range of current levels and corresponding brightness levels may be increased for a same PWM clock frequency.

In one aspect, an LED package comprises: an LED chip; and an LED driver configured to drive the LED chip by pulse width modulation (PWM), the LED driver comprising a plurality of current sources configured to provide varying current levels to the LED chip. In certain embodiments, at least two current sources of the plurality of current sources are configured to provide different current levels to the LED chip. In certain embodiments, at least two current sources of the plurality of current sources are configured to provide a same current level to the LED chip. In certain embodiments, the varying current levels comprise at least a first current level, a second current level that is greater than the first current level, and a third current level that is greater than the second current level. In certain embodiments, the plurality of current sources is configured to receive an output PWM signal that selects one or more current sources of the plurality of current sources for providing current to the LED chip. In certain embodiments, each current source of the plurality of current sources comprises a switch coupled to the LED chip and to a different output of the output PWM signal. In certain embodiments, the LED driver is configured to adjust the current level provided to the LED chip during less than half of a PWM period. In certain embodiments, the LED driver is configured to only adjust the current level provided to the LED chip during a single clock cycle of the PWM period. In certain embodiments, the single clock cycle is positioned at a start of the PWM period. In certain embodiments, for at least some current levels, the single clock cycle is positioned immediately following another clock cycle of the PWM period where the LED chip is turned on. In certain embodiments, for a particular current level, the LED driver is configured to turn on a unique combination of one or more current sources of the plurality of current sources as compared to a next-closest current level. The LED package may further comprise: an additional LED chip; and an additional LED driver configured to drive the additional LED chip by PWM, the additional LED driver comprising a plurality of additional current sources configured to provide varying current levels to the second LED chip.

In another aspect, a method of light output control within an LED package comprises: controlling brightness levels of an LED chip with pulse width modulation (PWM); and adjusting current levels to the LED chip during less than half of a PWM period. In certain embodiments, the current levels are only adjusted for a single clock cycle of the PWM period. In certain embodiments, the single clock cycle is positioned at a start of the PWM period. In certain embodiments, for at least some brightness levels, the single clock cycle is positioned immediately following another clock cycle where the LED chip is turned on. In certain embodiments, the current levels are either at a constant level or off for the remainder of the PWM period. In certain embodiments, adjusting current levels to the LED chip comprises turning on and off different current sources of a plurality of current sources connected to the LED chip. In certain embodiments, at least two current sources of the plurality of current sources provide different current levels to the LED chip. In certain embodiments, at least two current sources of the plurality of current sources provide a same current level to the LED chip. In certain embodiments, at least two current sources are turned on at a same time for at least one clock cycle of the PWM period for at least some of the brightness levels.

In another aspect, a light emitting device comprises: an LED chip; and an LED driver configured to drive the LED chip by pulse width modulation (PWM), the LED driver comprising a plurality of current sources configured to provide varying current levels to the LED chip. In certain embodiments, at least two current sources of the plurality of current sources are configured to provide different current levels to the LED chip. In certain embodiments, at least two current sources of the plurality of current sources are configured to provide a same current level to the LED chip. In certain embodiments, the LED driver is configured to only adjust the current level provided to the LED chip during a single clock cycle of a PWM period.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIGS. 5A and 5B are collectively a table representation of brightness values and current levels for the waveforms of FIGS. 4A and 4B and the plot of FIG. 4C.

FIGS. 6A and 6B are collectively a table representation of another varying current PWM implementation that is similar to FIGS. 5A and 5B except the current levels are only adjusted during a first clock cycle of the PWM period.

FIGS. 7A and 7B are collectively a table representation of a varying current PWM implementation that is similar to FIGS. 6A and 6B except the varying current segment is moved away from the first segment.

DETAILED DESCRIPTION

Figure 1:
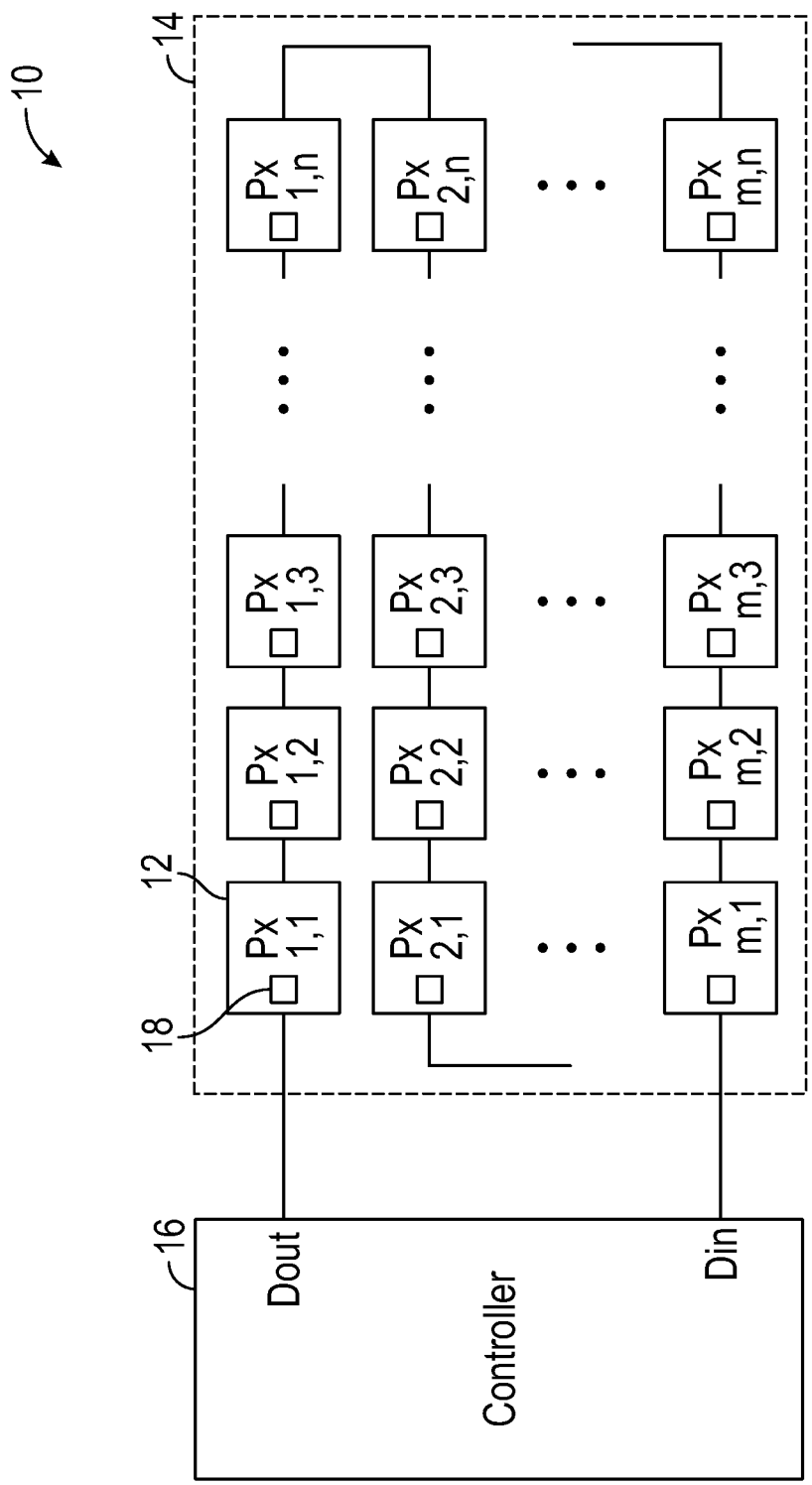
FIG. 1 is a block diagram illustrating a system level control scheme for a lighting device using cascade communication for serially connected light-emitting diode (LED) packages.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The present disclosure relates to light-emitting diode (LED) packages and, more particularly, to LED packages with varying current pulse width modulation (PWM) signals and related methods. Varying current PWM is provided by having multiple current sources at different current levels for each LED chip in an LED package. An output PWM signal for each LED chip is routed to selectively turn on and off different combinations of current sources to provide varying current levels associated with varying brightness levels for each LED chip. By providing multiple current sources for each LED chip, the dynamic range of current levels and corresponding brightness levels may be increased for a given PWM clock frequency and period.

In cascade digital communication, multiple electronic devices are arranged as repeaters to successively receive serial communication for operation. In the context of fine-pitch video displays, multiple LED packages are serially arranged as LED pixels to receive cascade communication. Incoming signals to each LED pixel are produced by another element, such as a master controller or the previous LED pixel, and the bitstream of incoming signals is derived from clock domains of one or more preceding devices. Proper distribution of communication signals to thousands of LED pixels creates challenges. Small sizes are required for LED packages to form pixels of high-resolution video displays and these size constraints provide further challenges.

As used herein, the terms "data stream" and "communication channel" may at times be used interchangeably. However, a "data stream" generally refers to a non-physical representation of data over time that flows through a set of at least one communication channel as well as the internal wiring and storage registers within various elements such as controllers and active electrical elements. A data stream may also be referred to as digital communication between two elements, such as a controller element that transmits digital communication and a receiver element that receives the digital communication. A "communication channel" generally refers to a physical medium through which the data stream is conveyed. For example, a communication channel may comprise a wire with associated electrical elements, an optical fiber, or even air as in the case of radio, light, or sound waves. A given physical channel could also be divided up in time or frequencies to allow multiple "communication channels" within one medium at once such as changing to a different frequency band. In certain aspects, communication channels may embody serial digital communication channels. Certain aspects relate to a binary communication channel that is a single wire referenced to a common conductor such as ground, which commonly can only hold one value at a time which is high or low voltage (e.g., digital "0" or "1") and is controlled by the output register of the preceding device. Two-wire differential signaling methods are also contemplated, but the preferred embodiment shown here refers to the single-wire approach primarily because of the added complexity of providing more traces with fine pitch displays.

In certain aspects, the present disclosure relates to light-emitting devices including LEDs, LED packages, and related LED displays and, more particularly, to active control of LEDs within LED displays. LED displays may include rows and columns of LEDs that form an array of LED pixels. A particular LED pixel may include a cluster of LED chips of the same color or multiple colors, with an exemplary LED pixel including a red LED chip, a green LED chip, and a blue LED chip. In certain embodiments, an LED package includes a plurality of LED chips that form at least one LED pixel, and a plurality of such LED packages may be arranged to form an array of LED pixels for an LED display. Each LED package may include its own active electrical element that is configured to receive a control signal and actively maintain an operating state, such as brightness or grey level or a color select signal for the LED chips of the LED device while other LED devices are being addressed. In certain embodiments, the active electrical element may include active circuitry that includes one or more of a driver device, a signal conditioning or transformation device, a memory device, a decoder device, an electrostatic discharge (ESD) protection device, a thermal management device, a detection device, a voltage and/or current sensing device, a command processing device, and other circuitry, among others. The active electrical element further includes circuitry to facilitate communication with multiple uncorrelated clock domains, including an original clock domain from a controller and a local clock domain derived within the active electrical element. In this regard, each LED pixel of an LED display may be configured for operation with active matrix addressing with mixed clock domain communication. The active electrical element may be configured to receive one or more of an analog control signal, an encoded analog control signal, a digital control signal, and an encoded digital control signal. In such arrangements, strings of LED packages, each with their own active electrical element, may be arranged for serial communication where each active electrical element receives data from a data stream and transmits data to the next active electrical element in the string of LED packages.

For active matrix addressing, each LED pixel is configured to actively maintain an operating state or otherwise control the driving state, such as brightness or grey level or color select, while other LED pixels are being addressed, thereby allowing each LED pixel to maintain or otherwise independently control their driving state and provide improved display and/or image recording with photographic equipment by reducing or eliminating effects caused by lower-frequency pulsing beating of the display light output with other non-synchronized equipment (e.g., lighting sources, other pulsed displays, or image capture equipment). Accordingly, each LED pixel may be configured to hold its respective operating state with a continuous drive signal, inclusive of pulse-width modulation (PWM), rather than by conventional methods using time division multiplexed signals scanning among groups of pixels that often result in the addition of low frequency components to the drive signals associated with passive matrix addressing. In this regard, each LED pixel may include an active electrical chip or an active electrical element that may include a memory device and the ability to alter a driving condition of the LED pixel based on a state stored in the memory of the active electrical element. In certain embodiments, the continuous drive signal is a constant analog drive current, and in other embodiments where the brightness level may be controlled by pulsed methods such as PWM, the continuous drive signal may refer to a PWM signal that is not interrupted by the time division multiplexed scanning of other LED pixels within the array or within a sub-array. In various embodiments, an active electrical element comprises an integrated circuit chip, an application-specific integrated circuit (ASIC), a microcontroller, or a field-programmable gate array (FPGA). In certain embodiments, active electrical elements may be configured to be programmable or reprogrammable after they are manufactured through various memory elements and logic that are incorporated within the active electrical elements.

As used herein, the terms "active electrical chip," "active electrical element," or "active electrical component" include any chip or component that is able to alter a driving condition of an LED based on memory or other information that may be stored within a chip or component. As used herein, the terms "active LED pixel" and "smart LED pixel" may be used interchangeably and may refer to a device that includes one or more LED devices or chips that form a pixel and an active electrical element or chip as described above. In certain embodiments, each LED pixel may comprise a single LED package that is configured as an active LED package that includes multiple LED chips and an active electrical element as described above. In this manner, the number of separate electrical devices needed for the LED display may be reduced, such as the separate electrical devices located on the backsides of LED panels of the LED display as previously described. Additionally, overall operating powers needed for operation of the LED panels may be reduced.

Performance of LED displays continues to advance. Previously, LED displays were more adept for static images such as LED signs rather than dynamic application such as video displays since many of the performance metrics expected for good video image display were lacking. Various performance metrics needed for consideration of LEDs for high-quality video display include resolution, contrast, viewing angle, dynamic range, brightness, frame rate, and color gamut, among others. Recent advancements in LED packages, improvements in LED driver quality, and cost reductions have greatly improved the resolution, among other requirements. As the resolution has increased, the packing density of LED packages, such as on printed circuit boards (PCBs) has also increased and become more complex. The driving of LEDs within LED packages to achieve high dynamic range simultaneously with high frame and refresh rates remains challenging. This is because current driving techniques require remote drivers placed on the opposing side of PCBs containing LED arrays. Packing density constraints dictate that the drivers need to be shared via time division multiplexing techniques, such as raster scan. As the preferred driving techniques for LEDs utilize PWM to set the brightness, ever-higher frequencies are required to achieve high dynamic range. Consequently, the dynamic range is limited by the highest frequency pulse that can be delivered in view of parasitic resistance, capacitance, and inductance. LED packages arranged as pixels for cascade serial communication afford the opportunity to provide drivers local to each LED package, thereby providing improved dynamic range by removing the need for shared drivers and greatly reducing the parasitic resistance, capacitance, and inductance.

For LED displays, a dynamic range of greater than 1000:1 is considered decent while a dynamic range of about 1,000,000:1 is desirable for high-performance applications with localized dimming. PWM is often applied to LEDs through a constant-current driver. In this regard, at any one current the brightness range can be anywhere from a minimum pulse width to a full and constant-on. Furthermore, the PWM period should be such that the blink rate of the minimum pulse isn't noticed, such as a rate of greater than 30 hertz (Hz). In this regard, to have 1,000,000:1 dynamic range, a dedicated PWM driver with a 30 megahertz (MHz) clock is needed. Some display technologies use 60 MHz, particularly if PWM drivers are multiplexed. However, parasitic power dissipation becomes significant at the higher clock rates, so this solution for high dynamic range may be undesirable.

The human eye can perceive around 20 stops of dynamic range (1,000,000:1) within one lighting condition and can adjust to lighting conditions over a much larger range. Having even more dynamic range is desired to provide for various different lighting levels. Additional needs may include providing for calibration and thermal compensation. In this regard, 16,000,000:1 may be a reasonable target for next-generation displays. If the upper limit for the PWM clock frequency does not provide for the targeted dynamic range, one approach may involve changing the current. However, the switching of the PWM drive from one current to another makes it difficult to match the observed LED brightness from one current to another. Accordingly, there may be a brightness discontinuity associated with the change of current if extreme measures are not taken to calibrate and adjust the PWM signal as compensation. Additionally, performance differences over temperature makes this task even more difficult. Therefore, in most systems where PWM is used, even with the ability to change current, a current is selected and fixed for the whole dynamic range of the display.

According to principles of the present disclosure, varying the current within a PWM drive signal is implemented in a manner that reduces or eliminates the brightness discontinuities described above. Rather than using a single current source with a fixed current level, multiple current sources at different current levels are provided for an individual LED chip within a package to increase a number of available non-zero PWM levels for enhanced dynamic range. By increasing available non-zero PWM levels for a PWM period, increased dynamic range may be provided without increasing frequency and associated power consumption. For example, the principles of the present disclosure may provide dynamic range of greater than 1000:1 up to 1,000,000:1, or up to 16,000,000:1 without requiring high clock frequencies. In some embodiments, a 10 Hz PWM clock frequency may be used in conjunction with about eight current sources to achieve 16,000,000:1 dynamic range and a PWM period of over 150 Hz. Accordingly, the dynamic range may be increased while also ensuring that the brightness changes are monotonic with each successive change of brightness level. In certain embodiments, each brightness level for the LED chip may include a unique combination of current sources and pulses. In further embodiments, the unique combination of current sources and pulses is implemented so that no successive brightness levels use a same combination of current sources to avoid problems associated with current variance from current sources.

FIG. 1 is a block diagram 10 illustrating a system level control scheme for a lighting device using cascade communication for serially connected LED packages 12. The lighting device may embody an LED display and each LED package 12 may form an LED pixel of the display. For such applications, the terms LED package and LED pixel may be used interchangeably, although it is recognized that an LED package may be composed of several LED pixels formed together in one component. An exemplary LED string 14 arranged for serial communication is indicated by a dashed box in FIG. 1. While only the single LED string 14 is provided in detail, one or more other LED strings may also be coupled with a controller 16. The controller 16 may comprise an integrated circuit, such as one or more of an ASIC, a microcontroller, a programmable control element, and an FPGA. In certain embodiments, the controller 16 may be referred to as a master controller for the LED string 14. In other embodiments, the controller 16 may be a sub-controller to which another master controller (not shown) delegates a set of tasks as it pertains to a larger system. A data signal out (Dout) of the controller 16 may be passed along the LED string 14 in a serial manner, and a return data signal in (Din) may be received back by the controller 16. The signal may include an original clock domain provided by the controller 16 or another master controller as described above. In FIG. 1, each LED package 12, or LED pixel, is provided with a label such as "Px 1,1" where the first number represents a row, and the second number represents a column. Each LED package 12 includes its own active electrical element 18 that is registered and housed therewithin so that each LED package 12 comprises logic for responding to received data signals.

According to the arrangement of FIG. 1, important aspects include delivery of high bit depth data to incorporated LED drivers within each LED package 12 and being capable of converting data effectively to energize the LED chips within each LED package 12 according to expected light output levels with increased dynamic range. In certain aspects, LED packages 12 and associated active electrical elements 18 are capable of transforming received data by way of compression and/or decompression techniques such as gamma function or correction. However, as this transformed data is used for input to a PWM driver, lower values may not produce the expected response from LED chips due to pulse width being shorter than time delay required to energize the LED chips. This can happen over several of the lowest brightness levels resulting in a dramatic reduction of the dynamic range. As disclosed herein, LED packages 12 and related methods are disclosed where integrated LED drivers are controlled such that the dynamic range is increased. As described later in greater detail, LED packages 12 are disclosed where varying current PWM is provided by multiple current sources for each individual LED chip within each LED package 12. The multiple current sources are controlled by the active electrical element 18 such that unique combinations or permutations of current sources and pulses are used within a PWM period to effectively increase a number of available non-zero brightness levels.

Figure 2:
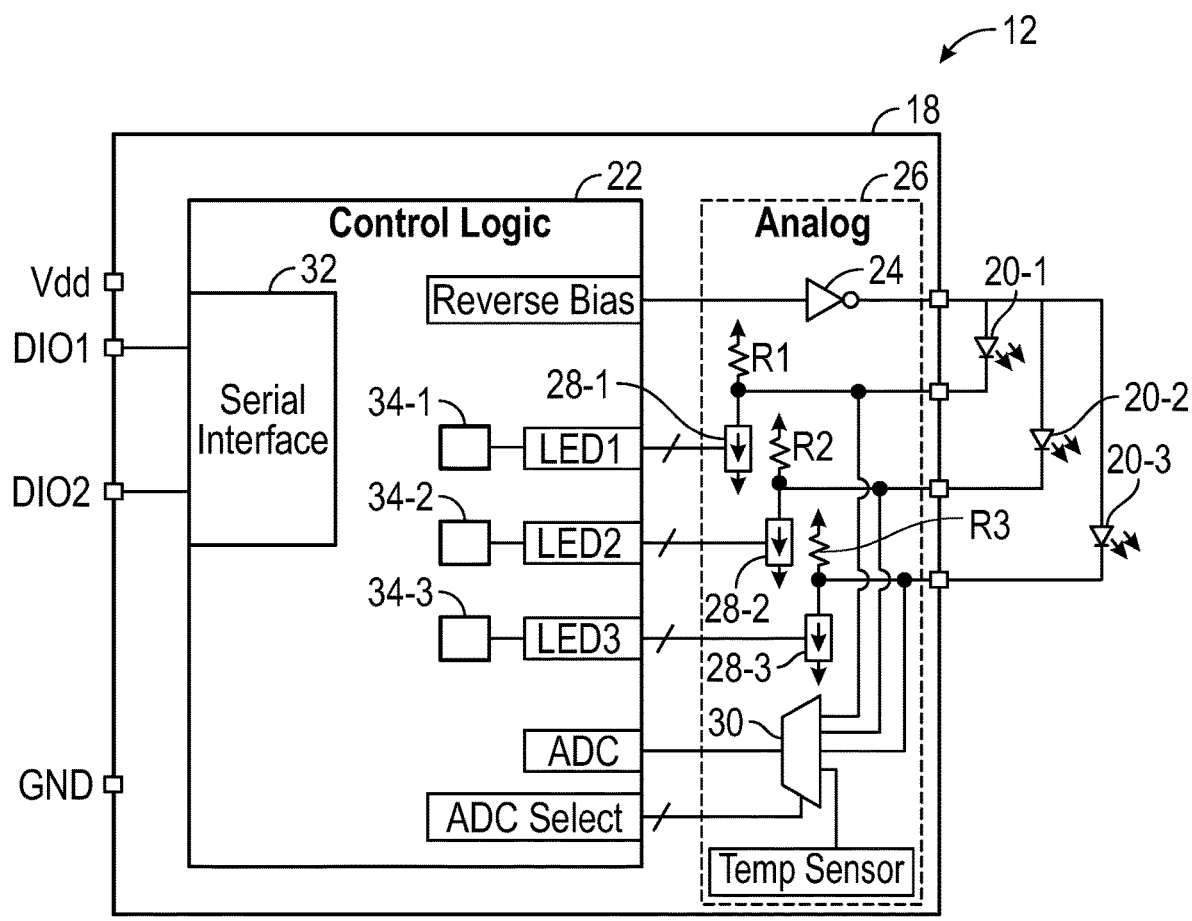
FIG. 2 is a block diagram of an LED package from FIG. 1 capable of providing varying current pulse width modulation (PWM) signals according to principles of the present disclosure.

FIG. 2 is a block diagram of an LED package 12 from FIG. 1 capable of providing varying current PWM signals according to principles of the present disclosure. The active electrical element 18 may include multiple ports represented by a supply voltage (Vdd), ground (GND), and bidirectional communication ports or digital input/output ports (DIO1 and DIO2) according to embodiments disclosed herein. By having the DIO1 and DIO2 ports configured as bidirectional ports, the active electrical element 18 may advantageously be able to detect an input signal from a communication channel and then assign one of the DIO1 and DIO2 ports as an input port and the other of the DIO1 and DIO2 ports as the output port. Such functionality may be provided by input/output buffers and/or an active switching network internal to the active electrical element and electrically coupled to the DIO1 and DIO2 ports. This provides flexibility in layouts for displays where a plurality of LED packages 12 are connected together for cascade communication. For example, multiple LED packages 12 may be arranged in multiple rows where data cascades from package-to-package along each row and in a serpentine manner from row-to-row as illustrated in FIG. 1. In such arrangements, the bidirectional communication ports allow the LED packages 12 to be mounted in a same orientation and receive and transmit digital communication left-to-right or right-to-left depending on the row position. In addition to the four ports of Vdd, GND, DIO1, and DIO2 on the left side of the block diagram, the active electrical element 18 includes four ports on the right side that are coupled with LEDs 20-1 to 20-3 of the LED package 12. In this regard, the LEDs 20-1 to 20-3 are packaged together with the active electrical element 18 in the common LED package 12 to form an individual pixel of a larger display. As used herein, the LEDs 20-1 to 20-3 may also be referred to as LED chips.

Certain elements of the active electrical element 18 are described below; however, it is understood that the active electrical element 18 may include many other components, including memory elements, signal conditioning elements, thermal management, electrostatic discharge elements, clock elements, and oscillators, among others. In FIG. 2, control logic 22 is arranged to receive input data, execute commands according to a command protocol, provide control signals for operation of the LEDs 20-1 to 20-3, report various voltage levels and/or temperature levels included with output data, and transmit the output data via the DIO1 and DIO2 ports to the next adjacent LED package. The control logic 22 may operate in the digital domain and may include input/output buffers electrically coupled to the DIO1 and DIO2 ports that assign input and output configurations for the bidirectional DIO1 and DIO2 ports.

In certain embodiments, the active electrical element 18 may be configured to provide both forward and reverse bias states to the LEDs 20-1 to 20-3. In this regard, the control logic 22 may include a reverse bias control output signal that, with appropriate active elements, is configured to supply either near-Vdd or near-GND voltage levels to the LEDs 20-1 to 20-3. Since the nomenclature "reverse bias" implies that a high level on the control logic 22 output produces a reverse bias condition, the output signal could simply be coupled with an inverter 24 that is provided in a driver 26 of the active electrical element 18. As such, the LEDs 20-1 to 20-3 may be either forward biased or reverse biased depending on a particular operating state and/or command received by the control logic 22. The inverter 24, or inverter logic element, may have sufficient output characteristics to drive the LEDs 20-1 to 20-3. The driver 26 may be substantially an analog interface of the active electrical element 18 that is electrically coupled with the control logic 22. The driver 26 may include controllable current sources 28-1 to 28-3, which could also be configured as LED sink drivers. Pull-up resistors R1 to R3 may be incorporated to provide paths to Vdd for each of the LEDs 20-1 to 20-3, which aid with the voltage measurement when configured for reverse bias. Each of the current sources 28-1 to 28-3 may be electrically coupled with digital output signals LED1 to LED3 of the control logic 22. The output signals LED1 to LED3 may be provided along multiple wires that are coupled to each of the current sources 28-1 to 28-3 for current selection purposes. The output signals LED1 to LED3 may embody PWM outputs of the control logic 22 for controlling operation of the LEDs 20-1 to 20-3. As will be later described for FIG. 3 in greater detail, each current source 28-1 to 28-3 in FIG. 2 includes multiple current sources at varying current levels to provide varying current PWM control to each LED chip 20-1 to 20-3. In this regard, each current source 28-1 to 28-3 may be referred to as an overall current source for a particular one of the LED chips 20-1 to 20-3 such that each overall current source is composed of multiple individual current sources at different current levels. The driver 26 may also include a multiplexer 30 electrically coupled with an analog-to-digital (ADC) converter and ADC selector of the control logic 22. Additionally, the driver 26 may include an on-chip temperature sensor that is provided through the multiplexer 30. In certain embodiments, the temperature sensor provides thermal compensation for the LEDs 20-1 to 20-3 via a thermal compensation curve and/or thermal shut down.

The active electrical element 18 further comprises a serial interface 32 that embodies a module with circuitry configured to decode and convert the incoming signal of the data stream into a bitstream in a local clock domain, which can be further processed by the control logic 22. In this manner, the serial interface 32 may also be referred to as a digital communication receiving device. The digital communication could be received from a controller (e.g., 16 of FIG. 1) and/or another LED package (e.g., 12 of FIG. 1) in a serial string. The serial interface 32 is further configured to retransmit the decoded and converted bitstream along with modified data to the communication channel to which another LED package or another external element is connected in a manner that is compatible with the overall LED display system.

In certain embodiments, the control logic 22 may include circuitry in the form of one or more PWM processors 34-1 to 34-3 that provide the output PWM signals LED1 to LED3. A separate PWM processor 34-1 to 34-3 may be provided for each LED chip 20-1 to 20-3, or the PWM processors 34-1 to 34-3 may be combined as single PWM processor for all of the LED chips 20-1 to 20-3. In certain embodiments, the one or more PWM processors 34-1 to 34-3 are configured to transform input PWM signals and then shift the transformed PWM values so pulse widths are provided to the LED chips 20-1 to 20-3 that compensate for delayed turn-on times.

Figure 3:
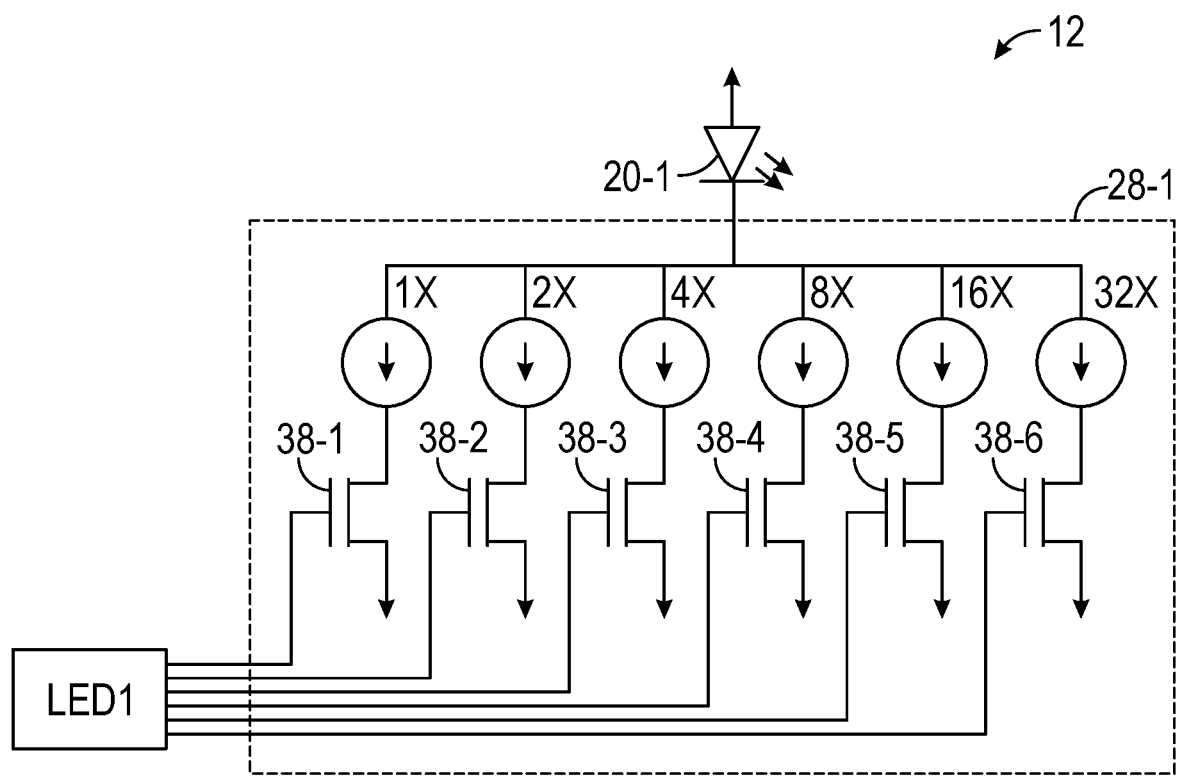
FIG. 3 is a schematic diagram of a portion of the LED package of FIG. 2 illustrating details of an overall current source for the LED chip of the LED package of FIG. 2.

FIG. 3 is a schematic diagram of a portion of the LED package 12 of FIG. 2 illustrating details of the overall current source 28-1 for the LED chip 20-1. While FIG. 3 is discussed in the context of the overall current source 28-1 for providing varying current PWM to the LED chip 20-1, it is understood that principles described are also applicable to each overall current source 28-1 to 28-3 of FIG. 2. In this manner, the overall current sources 28-2, 28-3 may also be configured for respectively providing varying current PWM to the LED chips 20-2, 20-3 of FIG. 2 in the same manner. By way of example, the overall current source 28-1 in FIG. 3 is illustrated with six current sources labeled as 1X, 2X, 4X, 8X, 16X, and 32X. However, the principles described are applicable to any number of multiple current sources for the LED chip 20-1.

As illustrated in FIG. 3, each current source 1X, 2x, 4X, 8X, 16X, and 32X is coupled to the same LED chip 20-1 for delivering different PWM current levels. By way of example, the current source 2X delivers two times the current as the current source 1X, the current source 4X delivers four times the current as the current source 1X, and so on. In this manner, each sequential current source 1X, 2X, 4X, 8X, and 32X provides double the current level of the previous one. As illustrated, each current source 1X, 2X, 4X, 8X, 16X, and 32X is coupled to a different output (e.g., different wire or electrically conductive path) of the output PWM signal LED1. In this manner, the output PWM signal LED1 is distributed to separately control a separate switch 38-1 to 38-6, such as a metal-oxide-semiconductor field-effect transistor (MOSFET), associated with each current source 1X, 2X, 4X, 8X, 16X, and 32X. Accordingly, depending on an intended brightness level for the LED chip 20-1, the output PWM signal LED1 may selectively turn on one or more of the current sources 1X, 2X, 4X, 8X, 16X, and 32X during a PWM period, thereby providing increased non-zero brightness levels. In certain embodiments, the choice to have the currents levels step by powers of two conveniently matches the current to a binary number encoded within the parallel output of the PWM signal LED1, thus providing a linear relationship between the current and the binary output value. However, other multi-current schemes are contemplated, such as having at least two or even all of the current source set to the same current. By way of example, a particular configuration may have at least two current sources that are the same (e.g., 1X, 1X) while having others that differ (e.g., 2X, 4X, 8X, . . . ). In other embodiments, the current levels may be intentionally tuned to values different than those representing exact powers of two in order to compensate for other nonlinearities or variation within the system.

As illustrated in FIGS. 2 and 3, the LED driver 26 and current sources 28-1 to 28-3 are advantageously incorporated within the active electrical element 18 of an LED package 12. In this regard, the LED package 12 may form an LED pixel configured for active matrix addressing in an LED display. However, the principles of varying current levels by way of multiple current sources within each overall current source 28-1 to 28-3 for each LED chip 20-1 to 20-3 are applicable to other implementations, such as light-emitting devices (e.g., systems or displays) where the driver 26 is separated from each LED package or LED pixel.

Figure 4A:
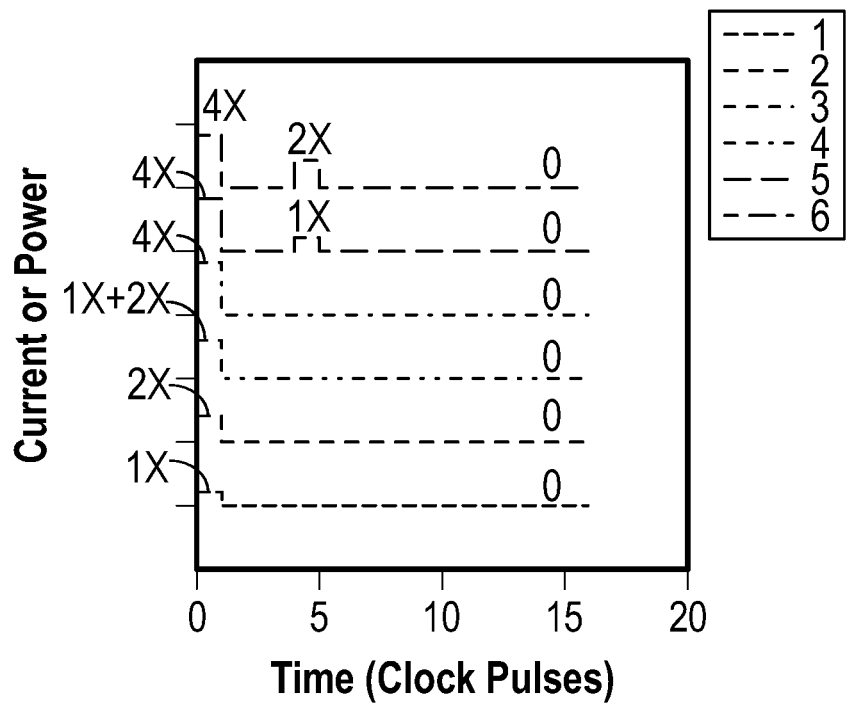
FIG. 4A is a waveform of an exemplary PWM drive signal for an LED chip at lowest brightness values or levels of a PWM period according to principles of the present disclosure.
Figure 4B:
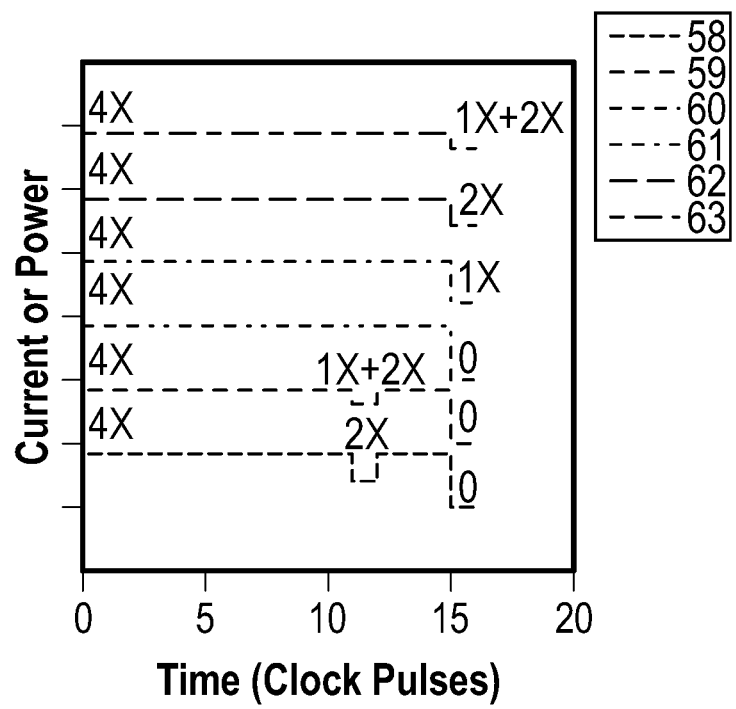
FIG. 4B is a waveform of the exemplary PWM drive signal of FIG. 4A for the LED chip at highest brightness levels of the PWM period.

FIGS. 4A to 4B illustrate waveforms of an exemplary PWM drive signal for an LED chip with multiple current sources 1X, 2X, and 4X according to principles of the present disclosure. The x-axis represents a 16-cycle PWM period and the y-axis represents the current level or power provided to the LED chip. For this example, three current sources 1X, 2X, and 4X are used to provide varying current PWM. As described in more detail below, the increased dynamic range is provided by implementing four different combinations of turned-on current sources 1X, 2X, 1X and 2X, or 4X for different clock cycles of the 16-cycle PWM period. Instead of having 15 or 16 different brightness levels for the 16-cycle period associated with traditional current ranging techniques, the varying current PWM of the present disclosure provides 63 non-zero brightness levels for a total of 64 brightness levels including zero. In this regard, a total number of available brightness levels may be increased up to 4 times the number of clock cycles in each PWM period based on having four different combinations of available current sources (i.e., 1X, 2X, 1X and 2X, or 4X).

FIG. 4A is a waveform of the exemplary PWM drive signal for the LED chip at lowest brightness values or levels. In this regard, separate waveform plot lines are provided for brightness levels 1 through 6. For brightness level 1, the current source 1X is turned on for the first clock cycle and turned off for the remaining fifteen clock cycles. For brightness level 2, the current source 2X is turned on for the first clock cycle and turned off for the remaining fifteen clock cycles. Since the current source 2X is twice the current as the current source 1X, the brightness is increased. For the brightness level 3, both the first and second current sources 1X, 2X are concurrently turned on for the first clock cycle and turned off for the remaining clock cycles. For the brightness level 4, the current source 4X is turned on for the first clock cycle and turned off for the remaining fifteen clock cycles. For the brightness level 5, the current source 4X is turned on for the first clock cycle and the current source 1X is turned on for the fourth clock cycle to provide an incremental increase in brightness over the brightness level 4. In a similar manner, the brightness level 6 is provided by instead turning on the current source 2X during the fourth clock cycle.

FIG. 4B is a waveform of the exemplary PWM drive signal for the LED chip at highest brightness levels. In this regard, separate waveform plot lines are provided for brightness levels 58 through 63. As illustrated, for each of the brightness levels, the current source 4X is turned on for most of the clock cycles and incremental changes in brightness are provided by turning on different combinations of other current sources 1X, 2X for certain clock cycles. For example, brightness level 63 is provided by turning on the current source 4X for the first fifteen clock cycle and turning off the current source 4X while turning on the current sources 1X and 2X for the last clock cycle. For incremental decreases for brightness levels, the last clock cycle is provided by only the current source 2X for brightness level 62 and only the current source 1X for the brightness level 61. For the brightness level 60, no current sources are on for the last clock cycle. To provide next lower brightness levels 59 and 58, different current sources are used to replace the current source 4X during the eleventh clock cycle (i.e., current sources 1X and 2X for brightness level 59, current source 2X for brightness level 58).

Figure 4C:
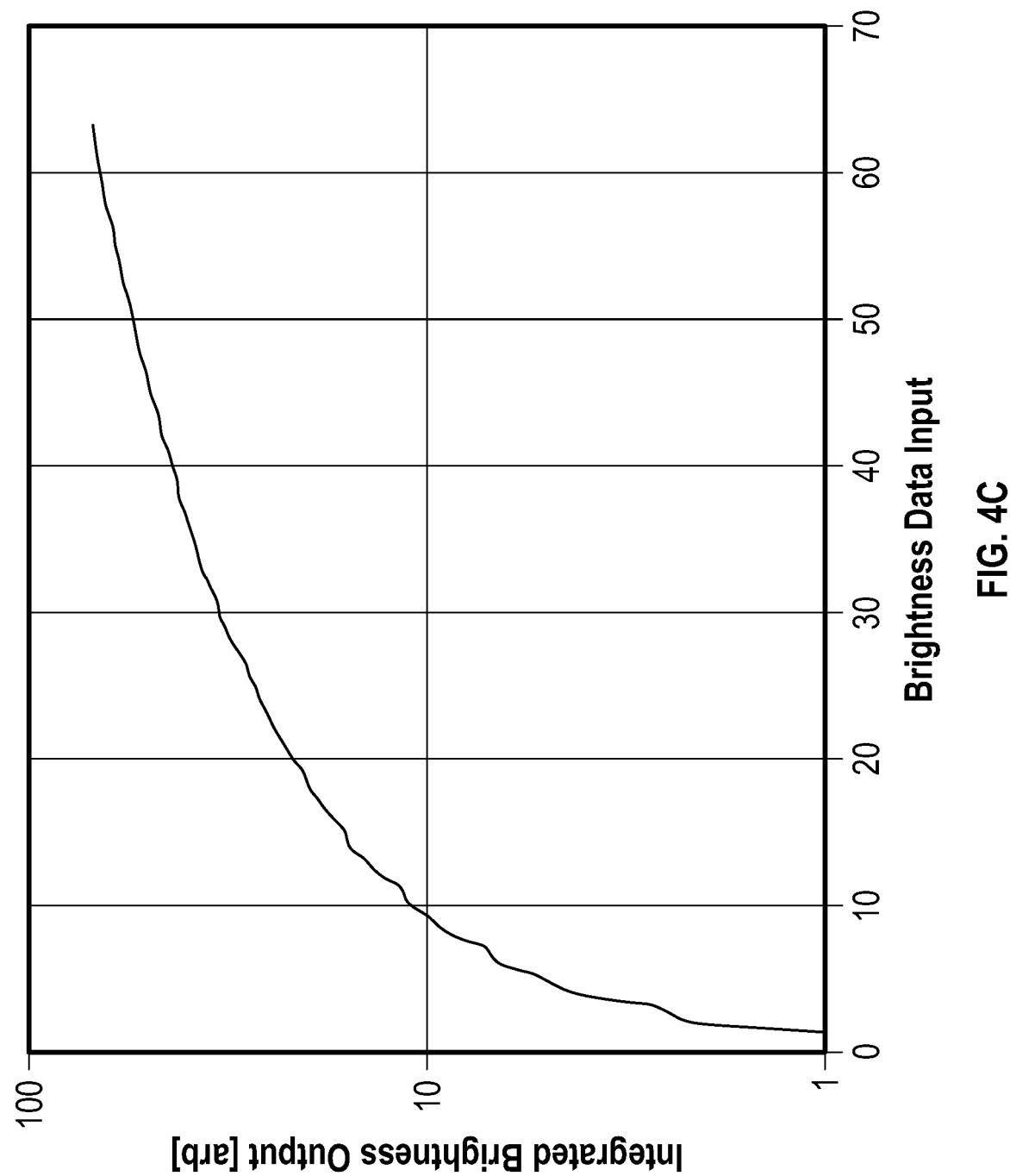
FIG. 4C is a brightness plot across all brightness levels from the lowest brightness levels of FIG. 4A to the highest brightness levels of FIG. 4B.

FIG. 4C is a brightness plot across all brightness levels from the lowest levels of FIG. 4A to the highest levels of FIG. 4B. The x-axis represents the brightness data input, or brightness level, showing 63 total brightness levels provided by turning on and off various combinations of the current sources 1X, 2X, and 4X for various clock cycles. The y-axis represents the integrated brightness in arbitrary units. The data of FIG. 4C assumes worst-case variability between the currents such that each successive current is ±20% of its intended value due to process variation. As illustrated, by providing 63 unique non-zero current and brightness levels, varying current PWM of the present disclosure provides smooth transitions in brightness levels from very dim levels to higher brightness levels. In practice, intended relationships between different current sources can vary by less than ±10%. Despite these variations, varying current PWM may still provide continuous and increasing brightness output through the brightness levels with reduced or nonexistent discontinuities typically associated with traditional current ranging techniques. In particular, a current ranging technique that uses one current over a certain range, then switches to another current over another range could have non-monotonic behavior where some brightness input values result in having less output brightness than lower values. Incorporating the current along with the PWM in the manner described herein ensures that the output behavior is monotonic and better represents the desired relationship to the input data.

Figure 5B:
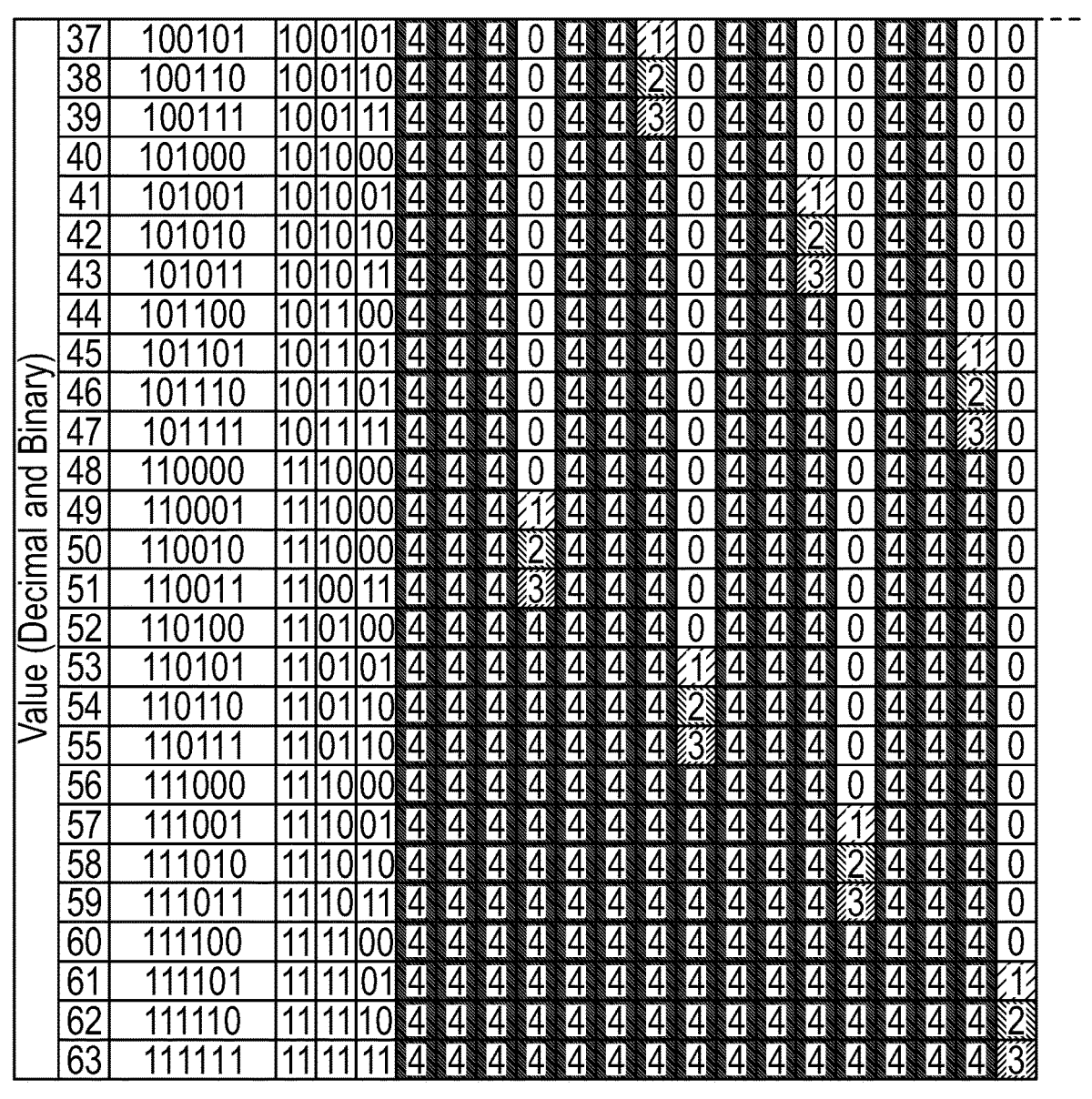

FIGS. 5A and 5B are collectively a table representation of brightness values and current levels for the waveforms of FIGS. 4A and 4B and the plot of FIG. 4C. Brightness values or levels are listed from 0 to 63 in decimal and binary. FIG. 5A shows brightness values 0 to 36 and FIG. 5B shows the remaining brightness values 37 to 63. The time in clock cycles of a PWM period is represented by 16 blocks of current levels for each row associated with a single one of the brightness values. Within each block of the PWM period, a value of "0" represents all current sources 1X, 2X, and 4X are off, a value of "1" represents the current source 1X is turned on, a value of "2" represents the current source 2X is turned on, a value of "3" represents the current sources 1X and 2X are turned on, and a values of "4" represents the current source 4X is turned on. The integrated power, or brightness output, is a sum of each respective block in each row for a given brightness value. For example, for brightness value 1, the current source 1X is turned on for the first clock cycle at a start of the PWM period and all current sources are turned off for the remaining clock cycles. Each incremental increase in brightness value provides a unique combination of turned on current sources 1X, 2X, 4X for certain clock cycles to provide the 63 unique brightness levels. Notably, this dynamic range is achieved while the current level provided by the different current sources 1X, 2X, 4X is adjusted or changed in less than half of the clock cycles of the PWM period. In this example embodiment, the current level is adjusted during only one of the PWM time segments for any given brightness level.

Figure 6A:
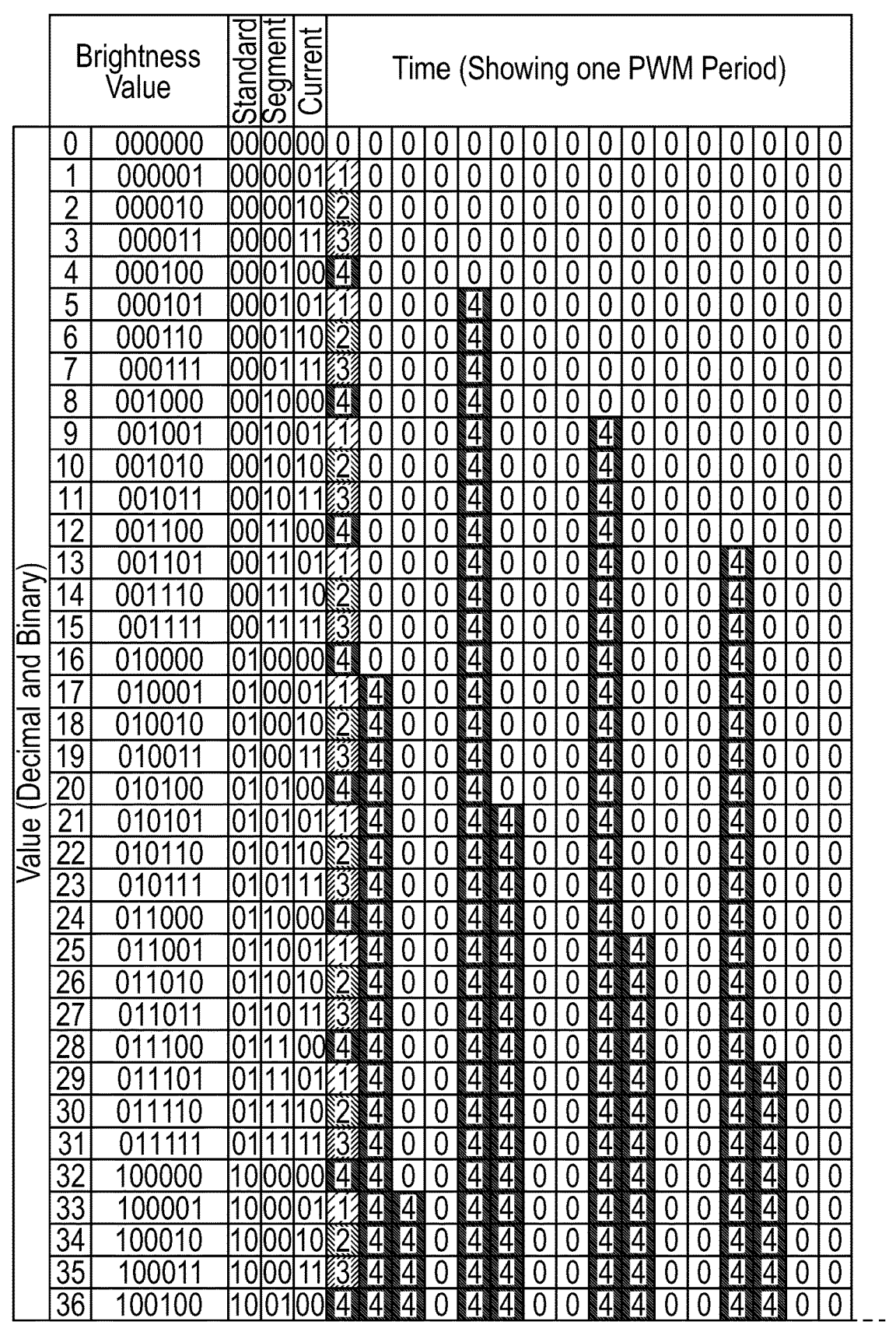
Figure 6B:
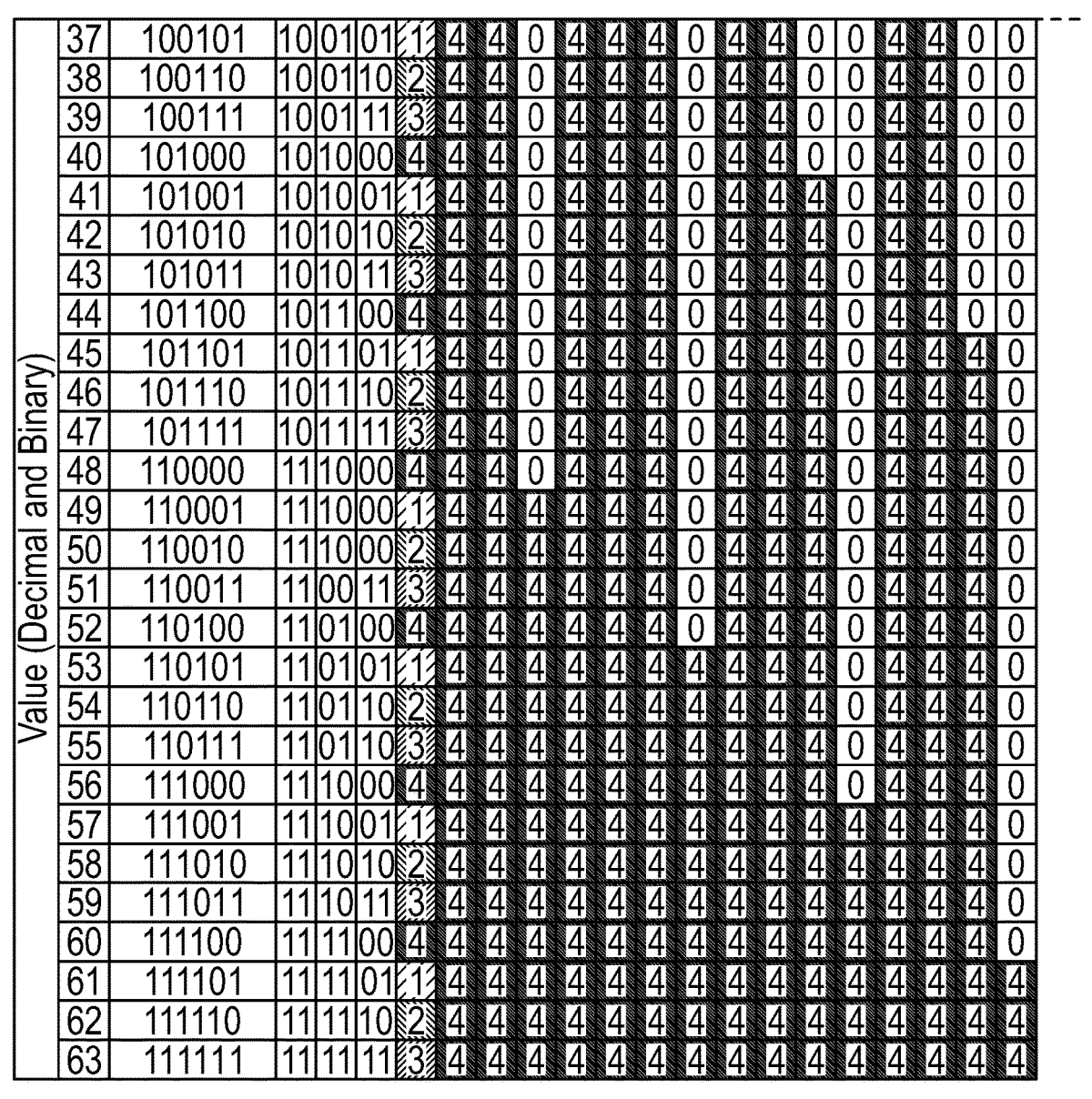

FIGS. 6A and 6B are collectively a table representation of another varying current PWM implementation that is similar to FIGS. 5A and 5B except the current levels are only adjusted during a first clock cycle of the PWM period. FIG. 6A shows brightness values 0 to 36 and FIG. 6B shows the remaining brightness values 37 to 63. As illustrated, the current selection of current sources 1X, 2X, 4X follows the least significant bits and occurs at the first clock cycle at a start of the PWM period. Accordingly, the current source for the first clock cycle cycles with a sequential progression from values of "1" to "4" from a brightness value of 1 to 63. The remainder of the PWM period involves only turning on or off the current source 4X. In this regard, after the initial clock cycle, current levels for all other clock cycles are either at a constant level or off. Despite only varying the current levels in first clock cycle, the implementation represented by FIGS. 6A and 6B may have a same brightness characteristic as the implementation represented by FIGS. 5A and 5B since the sums of each row are equivalent.

FIGS. 7A and 7B are collectively a table representation of a varying current PWM implementation that is similar to FIGS. 6A and 6B except the varying current clock cycle is moved away from the first clock cycle. FIG. 7A shows brightness values 0 to 36 and FIG. 7B shows the remaining brightness values 37 to 63. By moving the varying current clock cycle away from the first clock cycle, negative impacts associated with a turn-on delay for energizing the LED chip may be mitigated. Accordingly, fine resolution current adjustment may take place later in the PWM period. By way of example, the varying current clock cycle is provided at the thirteenth clock cycle in FIGS. 7A and 7B. In this manner, the fine resolution current selection is provided along the trailing edge of the PWM period to avoid impacts of any turn-on delays since the preceding PWM time segment is already on and the delay to reduce the brightness is much less than the time to turn the LED on.

In certain embodiments, the impact of turn-on delays for LED chips may be addressed by implementing data transformation and shift values to received data to provide increased dynamic range at lower levels. For example, shift values may be applied to transformed data so that pulse widths that are shorter than turn-on time delays for LED chips may be avoided. As such, with proper selection of shift values, all data values conveyed to the PWM driver produce light output from the respective LED chips. Further details regarding data transformation and shifting is disclosed in U.S. application Ser. No. 18/298,049 filed Apr. 10, 2023, the contents of which are incorporated herein in their entirety. Such data transformation and shift values may be implemented in combination with any of the varying current PWM techniques described above for FIGS. 4A to 7B.

The examples provided in FIGS. 4A to 7B are provided in the context of certain bit-depths. It is understood the principles disclosed are readily scaled to other bit-depth applications. By way of example, one embodiment may involve 16-32 bits with varying numbers of bits for different purposes, such as a 24-bit word with 6 bits used for segments, 8 bits for current select, and the remaining bits used for standard PWM within the segments. According to the principles disclosed, dynamic ranges may be achieved without increasing PWM clock frequencies.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A light-emitting diode (LED) package configured for receiving and transmitting digital communication signals, the LED package comprising:
    an LED chip; and
    an LED driver configured to drive the LED chip by pulse width modulation (PWM), the LED driver comprising a plurality of current sources configured to provide varying current levels to the LED chip, wherein the LED driver is configured to only adjust the current level provided to the LED chip during a single clock cycle of a PWM period.

2. The LED package of claim 1, wherein at least two current sources of the plurality of current sources are configured to provide different current levels to the LED chip.

3. The LED package of claim 1, wherein at least two current sources of the plurality of current sources are configured to provide a same current level to the LED chip.

4. The LED package of claim 1, wherein the varying current levels comprise at least a first current level, a second current level that is greater than the first current level, and a third current level that is greater than the second current level.

5. The LED package of claim 1, wherein the plurality of current sources is configured to receive an output PWM signal that selects one or more current sources of the plurality of current sources for providing current to the LED chip.

6. The LED package of claim 5, wherein each current source of the plurality of current sources comprises a switch coupled to the LED chip and to a different output of the output PWM signal.

7. The LED package of claim 1, wherein the single clock cycle is positioned at a start of the PWM period.

8. The LED package of claim 1, wherein for at least some current levels, the single clock cycle is positioned immediately following another clock cycle of the PWM period where the LED chip is turned on.

9. The LED package of claim 1, wherein for a particular current level, the LED driver is configured to turn on a unique combination of one or more current sources of the plurality of current sources as compared to a next-closest current level.

10. The LED package of claim 1, further comprising:
    an additional LED chip; and
    an additional LED driver configured to drive the additional LED chip by PWM, the additional LED driver comprising a plurality of additional current sources configured to provide varying current levels to the additional LED chip.

11. A method of light output control within a light-emitting diode (LED) package, the method comprising:
    controlling brightness levels of an LED chip with pulse width modulation (PWM); and
    adjusting current levels to the LED chip during less than half of a PWM period, wherein the current levels are only adjusted for a single clock cycle of the PWM period.

12. The method of claim 11, wherein the single clock cycle is positioned at a start of the PWM period.

13. The method of claim 11, wherein for at least some brightness levels, the single clock cycle is positioned immediately following another clock cycle of the PWM period where the LED chip is turned on.

14. The method of claim 11, wherein the current levels are either at a constant level or off for the remainder of the PWM period.

15. The method of claim 11, wherein adjusting current levels to the LED chip comprises turning on and off different current sources of a plurality of current sources connected to the LED chip.

16. The method of claim 15, wherein at least two current sources of the plurality of current sources provide different current levels to the LED chip.

17. The method of claim 15, wherein at least two current sources of the plurality of current sources provide a same current level to the LED chip.

18. The method of claim 15, wherein at least two current sources are turned on at a same time for at least one clock cycle of the PWM period for at least some of the brightness levels.

19. The method of claim 15, wherein:
    the LED chip is one of a plurality of LED chips within the LED package;
    the LED package comprises a separate LED driver for controlling each LED chip of the plurality of LED chips; and
    each LED driver comprises a plurality of current sources for providing different current levels.

20. A light-emitting device comprising:
    a light-emitting diode (LED) chip; and an LED driver configured to drive the LED chip by pulse width modulation (PWM), the LED driver comprising a plurality of current sources configured to provide varying current levels to the LED chip, wherein the LED driver is configured to only adjust the current level provided to the LED chip during a single clock cycle of a PWM period.

21. The LED device of claim 20, wherein at least two current sources of the plurality of current sources are configured to provide different current levels to the LED chip.

22. The LED device of claim 20, wherein at least two current sources of the plurality of current sources are configured to provide a same current level to the LED chip.

* * * * *